United States Patent [19]
Saiki et al.

[11] Patent Number: 5,157,354
[45] Date of Patent: Oct. 20, 1992

[54] PHASE-LOCKED LOOP IC HAVING ECL BUFFERS

[75] Inventors: Eisaku Saiki; Shintaro Suzumura, both of Yokohama; Fukashi Ohi, Odawara; Akira Uragami, Takasaki; Tsuyoshi Tateyama, Yokohama, all of Japan

[73] Assignees: Hitachi, Ltd., Tokyo; Hitachi Video & Information System, Inc., Kanagawa, Japan

[21] Appl. No.: 799,442

[22] Filed: Nov. 27, 1991

[30] Foreign Application Priority Data

Nov. 28, 1990 [JP] Japan ................................ 2-331562

[51] Int. Cl.$^5$ ...................... H03L 7/087; H03L 7/093
[52] U.S. Cl. ........................................ 331/1 A; 331/8; 331/11; 331/17; 331/25; 331/27; 307/514; 328/133; 360/51
[58] Field of Search ...................... 331/1 A, 8, 11, 17, 331/25, 27; 307/514; 328/133; 360/51

[56] References Cited

U.S. PATENT DOCUMENTS

| | | | |
|---|---|---|---|
| 4,787,097 | 11/1988 | Rizzo | 331/11 X |
| 4,803,705 | 2/1989 | Gillingham et al. | 331/1 A X |
| 4,942,370 | 7/1990 | Shigemori | 331/1 A |
| 4,943,788 | 7/1990 | Laws et al. | 331/11 |

OTHER PUBLICATIONS

Journal of Solid-State Circuits, vol. 23, No. 2, Apr. 1988, pp. 474-479, Kato et al., "A Low-Power 128-MHz VCO for Monolithic PLL IC's".

Primary Examiner—Siegfried H. Grimm
Attorney, Agent, or Firm—Antonelli, Terry, Stout & Kraus

[57] ABSTRACT

A phase locked loop IC comprising a voltage controlled oscillator which generates a clock signal in accordance with a control voltage, a first ECL input buffer which is an input buffer for a signal to be synchronized, a phase-lock capture circuit for producing a current determinative of the control voltage in accordance with the phase difference and the frequency difference between the signal to be synchronized and the clock signal, and a phase-lock follow-up circuit for producing a current determinative of the control voltage in accordance with the phase difference between the clock signal and the signal to be synchronized; wherein the supply voltage system of the first ECL input buffer is so disposed as to be isolated from any of the supply voltage systems of the voltage-controlled oscillator, the phase-lock capture circuit and the phase lock follow-up circuit, while the ground system of the first ECL input buffer is so disposed as to be insolated from any of the ground systems of the voltage-controlled oscillator, the phase-lock capture circuit and the phase-lock follow-up circuit.

31 Claims, 27 Drawing Sheets (a)

FIG. 13 (b)

| INPUT SIGNALS | | ANALOG SWITCHES | | | |
|---|---|---|---|---|---|
| 209 | 112 | M11 | M12 | M21 | M22 |
| L | L | × | ○ | × | × |
| L | H | ○ | ○ | × | × |
| H | L | × | × | × | ○ |
| H | H | × | × | ○ | ○ |

○: ON
×: OFF

PHASE-LOCKED LOOP IC HAVING ECL BUFFERS

BACKGROUND OF THE INVENTION

1. Field of the Invention

The present invention relates to phase locked loop ICs. More particularly, it relates to a phase-locked loop IC which is well suited to a magnetic disk storage device of the type transferring data at high speed, and an information processing system having such a magnetic disk storage device.

2. Description of the Related Art

In, for example, a magnetic disk storage device in the prior art, a phase locked loop circuit which generates a synchronizing clock for reproducing recorded data is usually constructed of a PLL (Phase-Locked Loop) shown in FIG. 25.

Referring to the figure, a phase comparator 1 compares the phases of a data signal 5 and a VCO clock (synchronizing clock) 10 which is produced by a voltage-controlled oscillator (abbreviated to "VCO") 4. When the phase of the data signal 5 leads over that of the VCO clock 10, the comparator 1 delivers an INC (increase) signal 6 for a corresponding time period, whereas when the former lags the latter, it delivers a DEC (decrease) signal 7.

Upon receiving the INC signal 6 or the DEC signal 7, a charge pump 2 performs a charge operation responsive to the INC signal 6 or a discharge operation responsive to the DEC signal 7.

A loop filter 3 integrates and smooths the output 8 of the charge pump 2 so as to generate a VCO control voltage 9. The VCO 4 produces the VCO clock 10 at a frequency corresponding to the VCO control voltage 9.

The phase locked loop circuit operates in this manner, thereby bringing the phase of the VCO clock 10 into agreement with that of the data signal 5.

Constants indicating the response characteristics of the PLL include a characteristic frequency Wn and an attenuation factor $\xi$. These constants are determined by such conditions as an initial phase difference and a phase capture time Taq.

Here, assuming that the length of each pattern to be synchronized is fixed, the phase capture time Taq depends upon the transfer rate of data, because the phase of the VCO clock must be captured within the time span of the pattern to be synchronized.

The phase-locked loop circuit of the magnetic disk storage in the prior art has the characteristic frequency Wn set high and the attenuation factor $\xi$ set small in order to complete the phase lock capture within the time span of the pattern to be synchronized.

Then, after the completion of the phase-lock capture, the phase-locked loop circuit has the characteristic frequency Wn set lower and the attenuation factor $\xi$ set greater than in the phase-lock capture process in order to stably phase-lock the VCO clock 10 to random data patterns.

In the prior art magnetic disk storage, the rotational speed of a magnetic disk is ordinarily set at 3,600 r.p.m., and the length of each pattern to be synchronized at 11 bytes or so.

With the recent progress of recording tecnology, etc., the recording density has been increased year by year. At present, even a storage device which has a recording density exceeding 26,000 b.p.i. is available as a commercial product.

Here, the data transfer rate of a 5Δ disk becomes about 15 Mb.p.s. under the conditions of the rotational speed of 3,600 r.p.m. and recording density of 26,000 b.p.i.

Besides, the capture time becomes about 3.2 $\mu$s in order to capture the phase of the VCO clock for each 6 byte pattern to be synchronized under the above specifications.

In the phase-locked loop circuit, the free-running oscillation frequency of the VCO 4 is set at a value conformed to the data transfer rate. In this regard, the loop circuit is contrived so as to widen the phaselockable capture frequency range (a capture range) as much as possible, taking into consideration situations where the freerunning oscillation frequency of the VCO 4 deviates from the set value on account of the temperature characteristics, the supply voltage characteristics, etc. of the circuit, and where the cycle of the patterns to be synchronized changes due to the rotational fluctuation, etc. of the magnetic disk. Moreover, in the magnetic disk storage device, the cycle of the read data signal fluctuates greatly relative to its expected value on account of magnetic interference, etc. Therefore, the loop circuit is contrived so as to similarly widen a phase lockable follow-up frequency range (a lock range) as much as possible.

The single-chip LSIs of phase locked loop circuits intended to cope with the high speed data transfer of the magnetic disk storage device, are currently on the market. However, the highest data transfer rates of these single chip LSIs are 15 Mb.p.s. to 24 Mb.p.s.

Regarding large sized magnetic disk storage device, there is an example wherein a phase locked loop circuit is constructed of discrete components of rapid ECL, thereby realizing the highest data transfer rate of 36 Mb.p.s.

Meanwhile, PLL frequency synthesizers, etc. conformed to high frequencies for use in communication equipment, etc. are on the market, and the signal frequencies to be dealt with are generally higher as compared with those of the magnetic disk storage device.

In a communication system, however, the high speed capture as in the magnetic disk storage device is not required. Moreover, since the quality of the data signal is comparatively good, it is not necessary to secure a wide capture range and a wide lock range.

At present, many kinds of products which can conform to 180 MHz or higher frequencies are commerically available as PLL frequency synthesizers.

In recent years, however, a higher operating speed has been increasingly required of the whole information processing system. As regards magnetic disk storage, for example, included in the system, it has become an important technical objective to heighten the data transfer rate thereof, as well as enlarging the memory capacity thereof.

Therefore, it has also become common practice to realize a higher data transfer rate by raising the rotational speed of the magnetic disk beyond the ordinary value of 3,600 r.p.m.

In general, the magnetic disk storage device has a fixed write frequency. In order to attain the larger memory capacity, however, zone-bit recording wherein the write frequency is varied radially on the magnetic disk has been devised and has already been put into practical use in some examples.

With the zone-bit recording, the write frequency is made unequal at the inner and outer peripheral parts of the magnetic disk, whereby the recording density is optimised as much as possible so as to enlarge the memory capacity. Consequently, the data transfer rate changes depending on the radial position of the data on the magnetic disk, and it becomes higher at the outer peripheral part than at the inner peripheral part.

The data transfer rate should desirably be heightened by adopting the higher speed rotation or the new recording technique in this manner. When the higher speed rotation and the new recording technique are conjointly utilized, the data transfer rate can be greatly increased, as has been the case in recent developments.

Nevertheless, regarding the phase-locked loop circuit in the prior art, at the highest level of present-day technology, the single-chip LSI can only attain its highest data transfer rate of 32 Mb.p.s. or so, and the circuit arrangement configured of the discrete components of rapid ECL etc. can achieve the highest data transfer rate of 36 Mb.p.s. Since these have been realized for use in magnetic disk storage. Data transfer at a still higher rate has not yet actually been attained.

SUMMARY OF THE INVENTION

Therefore, the object of the present invention is to provide a phase-locked loop IC which can conform to a higher data transfer rate.

In order to accomplish the object, the present invention provides a first phase-locked loop IC comprising: a voltage-controlled oscillator which generates a clock signal being an output signal at a frequency corresponding to a control voltage; a first ECL input buffer which is an input buffer for a signal to be synchronized being a signal of ECL level applied from outside the IC; phase lock capture means for producing a current in accordance with a phase difference and a frequency difference between the clock signal and the signal to be synchronized passed through the first ECL input buffer, the current determining a value of the control voltage of the voltage-controlled oscillator so that the phase and frequency of the clock signal may be respectively equalized to the phase and frequency of the signal to be synchronized; and phase-lock follow-up means for producing a current in accordance with a phase difference between the clock signal and the signal to be synchronized passed through the first ECL input buffer, the current determining a value of the control voltage of the voltage-controlled oscillator so that the phase of the clock signal may follow up the phase of the signal to be synchronized; wherein an external supply voltage terminal is connected to that supply voltage system of the first ECL input buffer which is electrically isolated at least from any of the supply voltage systems of the voltage-controlled oscillator, the phase-lock capture means, or the phase-lock follow-up means, while an external ground terminal is connected to that ground system of the first ECL input buffer which is electrically isolated at least from any of the ground systems of the voltage-controlled oscillator, the phase-lock capture means, or the phase-lock follow-up means.

Also, the present invention for accomplishing the object provides a second phase locked loop IC comprising: a voltage controlled oscillator which generates a clock signal being an output signal at a frequency corresponding to a control voltage; a first ECL input buffer which is an input buffer for a signal to be synchronized being a signal of ECL level applied from outside the IC; a phase frequency comparator which delivers a timing signal corresponding to a phase difference and a frequency difference between the clock signal and the signal to be synchronized passed through the first ECL input buffer, as well as a charge pump which produces a current corresponding to the timing signal delivered by the phase frequency comparator; and a phase comparator which delivers a timing signal corresponding to a phase difference between the clock signal and the signal to be synchronized passed through the first ECL input buffer, as well as a smoothing filter which produces a current corresponding to the timing signal delivered by the phase comparator; wherein a supply voltage system of the first ECL input buffer is so disposed as to be electrically isolated at least from any of the supply voltage systems of the voltage controlled oscillator, the charge pump, and the smoothing filter, while the ground system of the first ECL input buffer is so disposed as to be electrically isolated at least from any of the ground systems of the voltage controlled oscillator, the charge pump, and the smoothing filter.

According to the first phase-locked loop IC of the present invention, the signal of ECL level can be turned into the signal to be synchronized by the first ECL input buffer, and besides, the external supply voltage terminal connected to the supply voltage system of the first ECL input buffer is so disposed as to be electrically isolated from any of the supply voltage systems of the voltage controlled oscillator, the phase-lock capture means and the phase-lock follow-up means, while the external ground terminal connected to the ground system of the first ECL input buffer is so disposed as to be electrically isolated from any of the ground systems of the voltage-controlled oscillator, the phase-lock capture means and the phase lock follow-up means. Therefore, interferences attributable to the supply voltage systems and ground systems can be excluded, and the clock signal can be phase-locked favorably to the high-speed signal to be synchronized with jitters suppressed as much as possible.

Also, according to the second phase-locked loop IC of the present invention, there is comprised the first ECL input buffer which is the input buffer for the signal to be synchronized being the signal of ECL level applied from outside the IC, and the supply voltage system of the first ECL input buffer is electrically isolated from any of the supply voltage systems of the voltage-controlled oscillator, the charge pump or the smoothing filter, while the ground system of the first ECL input buffer is electrically isolated from any of the ground systems of the voltage-controlled oscillator, the charge pump or the smoothing filter. Therefore, interference attributable to the supply voltage systems and ground systems can be excluded, and the clock signal can be phase-locked favorably to the high-speed signal to be synchronized with jitter suppressed as much as possible.

BRIEF DESCRIPTION OF THE DRAWINGS

FIG. 5(a) is a circuit diagram showing the arrangement of a frequency divider circuit, while FIG. 5(b) is an explanatory diagram showing the operation of the frequency divider circuit;

FIG. 10(a) is a circuit diagram showing the configuration of a phase comparator, while FIG. 10(b) is a timing chart showing the operations of the phase comparator and a smoothing filter;

FIG. 13(a) is a block diagram showing the constitution of a loop filter, while FIG. 13(b) is an explanatory diagram showing the operation of the loop filter;

DETAILED DESCRIPTION OF THE PREFERRED EMBODIMENTS

Now, an embodiment of a phase-locked loop IC according to the present invention will be described.

Figure 1:
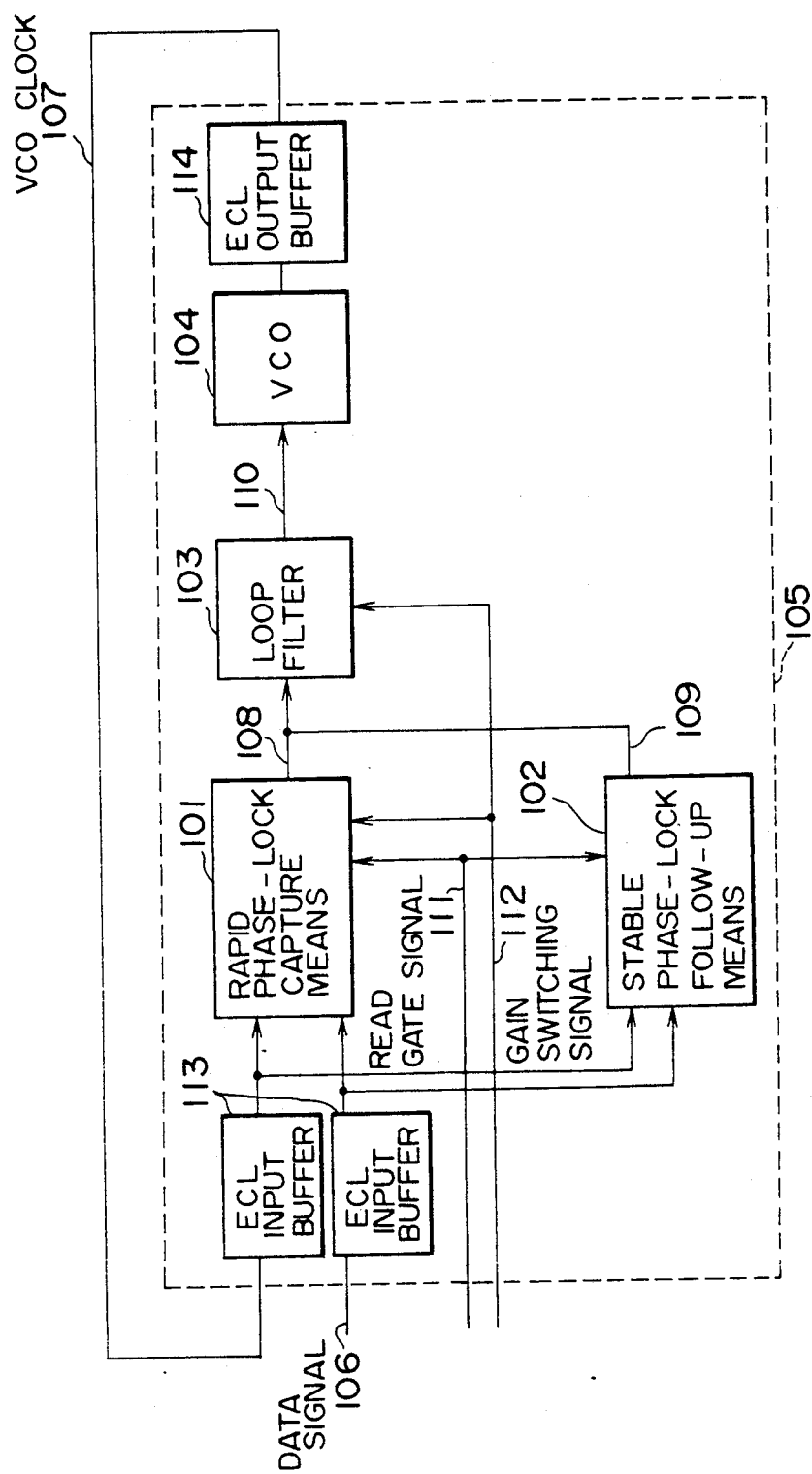
FIG. 1 is a block diagram showing the first construction of a phase-locked loop IC according to an embodiment of the present invention.

FIG. 1 is a block diagram showing the first construction of the phase-locked loop IC 105 in this embodiment.

As illustrated in the figure, the phase locked loop IC 105 in this embodiment includes ECL input buffers 113 which are input buffers for a data signal 106 and a VCO clock 107, rapid phase-lock capture means 101, stable phase-lock follow-up means 102, a loop filter 103 which converts the current output 108 of the rapid phase lock capture means 101 or the current output 109 of the stable phase lock follow-up means 102 into a voltage, a VCO 104 which generates the VCO clock 107 being a clock at a frequency corresponding to the output voltage 110 of the loop filter 103, and an ECL output buffer 114 which is an output buffer for the VCO clock 107.

The phase-locked loop IC 105 operates so as to phase lock the VCO clock 107 to the data signal 106 in the case where a read gate signal 111 is valid. This IC 105 is switched between a phase-lock capture operation or a phase-lock follow-up operation depending on the value of the gain switching signal 112.

In the phase-lock capture operation, the rapid phase-lock capture means 101 is used for capturing the VCO clock 107 to the pattern to-be synchronized of the data signal 106. On the other hand, in the phase-lock follow-up operation, the stable phase-lock follow up means 102 is used for causing the VCO clock 107 to stably follow up the random data pattern of the data signal 106.

Figure 2:
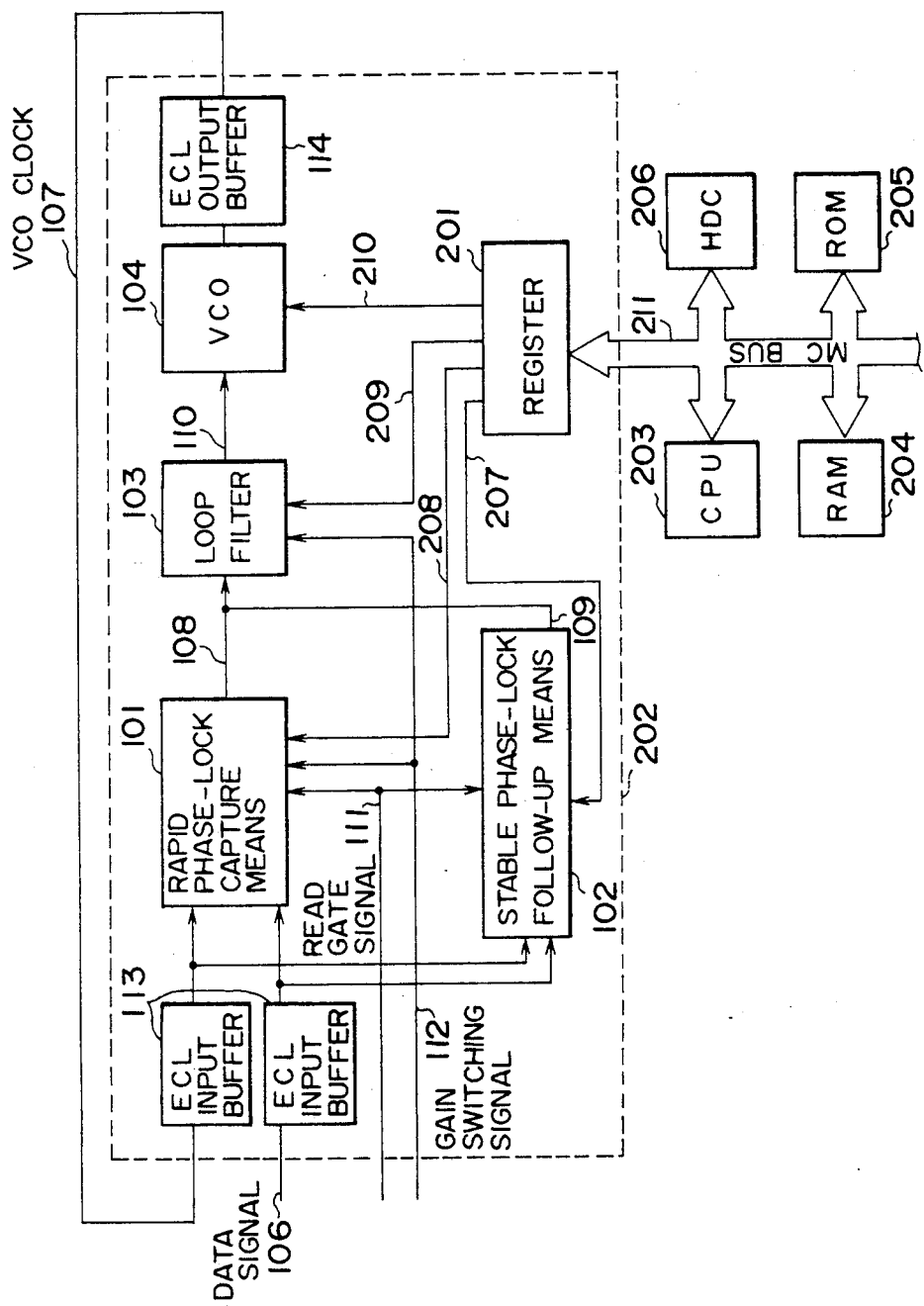
FIG. 2 is a block diagram showing the second construction of the phase-locked loop IC.

Next, the second construction of the phase-locked loop IC in this embodiment is shown in FIG. 2, together with the peripheral construction thereof.

As illustrated in FIG. 2, this construction is furnished, besides the foregoing construction shown in FIG. 1, with a register 201 which stores therein switching selection information items, such as gains and constants, to be afforded to the PLL and individual blocks of the IC 202 through switching selection signals 207, 208, 209 and 210; a microcomputer bus 211 through which the information items are written into the register 201; a CPU 203 which executes the arithmetic processing of the whole construction; an HDC (hard disk controller) 206 which performs the control of the whole construction; and a RAM 204 or a ROM 205 in which the programs of the CPU 203 and data items such as optimum constants are stored.

The switching selection signals 207, 208, 209 and 210 which are the output control signals of the register 201, serve to alter the response characteristics of the PLL and to optimize the circuit characteristics of the circuit blocks. They play important roles in the relief of window margin loss and realization of high-speed data transfer.

Incidentally, this construction is especially suitable for application in a system of the high-speed data transfer type employing the zone-bit recording technique, wherein a write frequency is varied depending upon write positions or the disk, in order to raise the data transfer rate and to enlarge the memory capacity.

The rapid phase-lock capture means 101 shown in FIGS. 1 and 2 will now be described.

Figure 3:
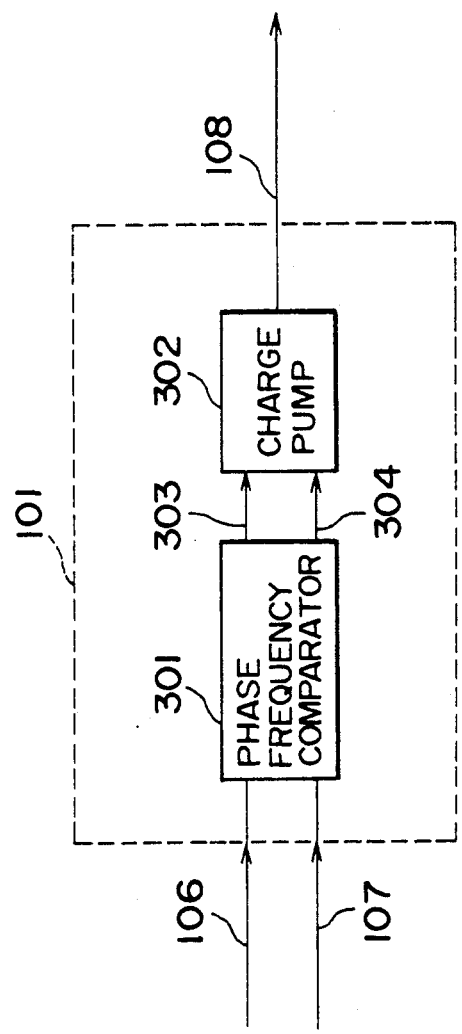
FIG. 3 is a block diagram showing the constitution of rapid phase-lock capture means.

The constitution of this rapid phase-lock capture means is shown in FIG. 3.

As illustrated in the figure, the rapid phase-lock capture means 101 can be comprised of a phase frequency comparator 301 and a charge pump 302.

Figure 4:
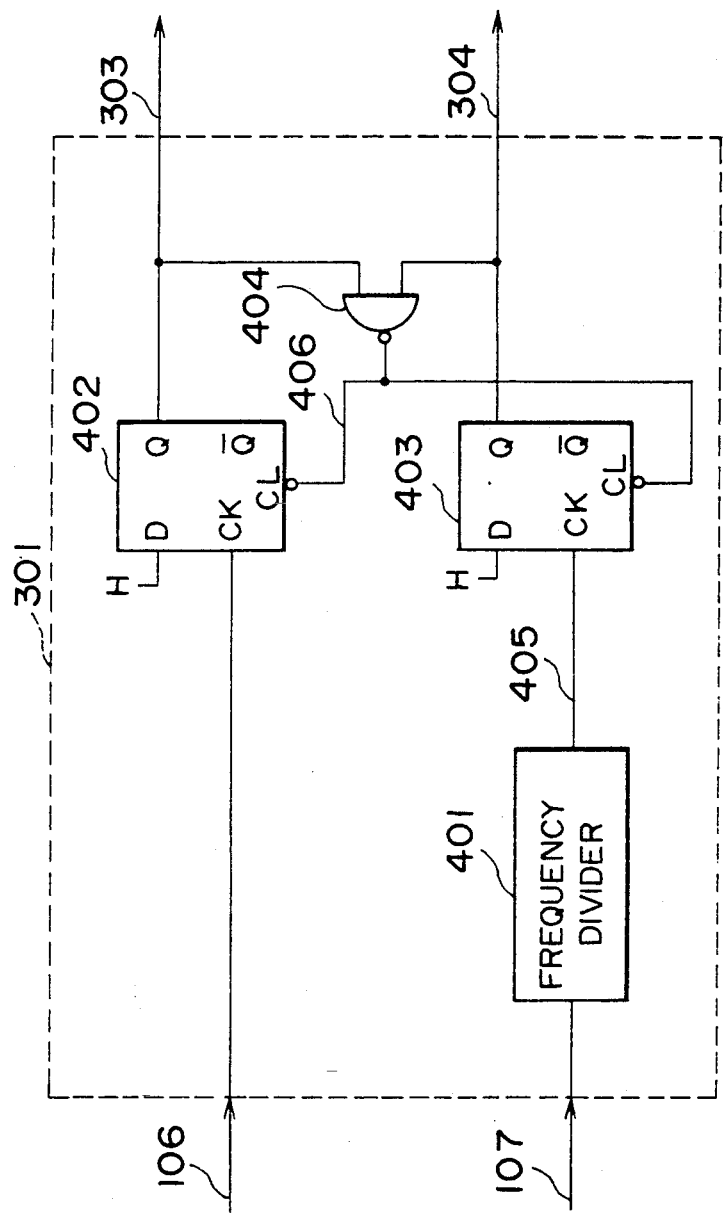
FIG. 4 is a block diagram showing the configuration of a phase frequency comparator.

FIG. 4 shows the configuration of the phase frequency comparator 301.

As illustrated in the figure, the phase frequency comparator 301 is comprised of a frequency divider circuit 401, flip-flops 402 and 403, and a NAND gate 404.

The illustrated circuit operates as follows:

The frequency divider circuit 401 divides the frequency of the VCO clock 107 so as to equalize to the frequency of the pattern to be synchronized of the data signal 106. Thus, it produces the divide-frequency clock 405.

The ratio of the frequency division is determined by the data signal pattern (the pattern to be synchronized)

at the phase-lock capture, and it differs depending upon the recording code system employed.

By way of example, the frequency is divided by 3 for the 1-7RLLC system and by 4 for the 2-7RLLC system.

The phase frequency comparator 301 delivers an INC (increase) signal 303 or a DEC (decrease) signal 304 in accordance with the phase difference between the data signal 106 and the VCO clock 107.

In a case where the phase of the data signal 106 leads over that of the VCO clock 107, the INC signal 303 first rises incident with the rise of the data signal 106. Thereafter, the DEC signal 304 rises incident with the divided-frequency clock 405. The output 406 of the NAND gate 404 will then become an "L" (low) level once signals 303 and 304 are both active (high). Then, the flip-flops 402 and 403 are both reset, so that the INC signal 303 and the DEC signal 304 fall.

Conversely, in a case where the phase of the data signal 106 lags over that of the VCO clock 107, the DEC signal 304 first rises incident with the rise of the divided-frequency clock 405. Thereafter, at the INC signal 303 rises incident with the data signal 106. The output 406 of the NAND gate 404 will then become an "L" level. Then, the flip flops 402 and 403 are reset, so that the INC signal 303 and the DEC signal 304 fall.

Figure 5:
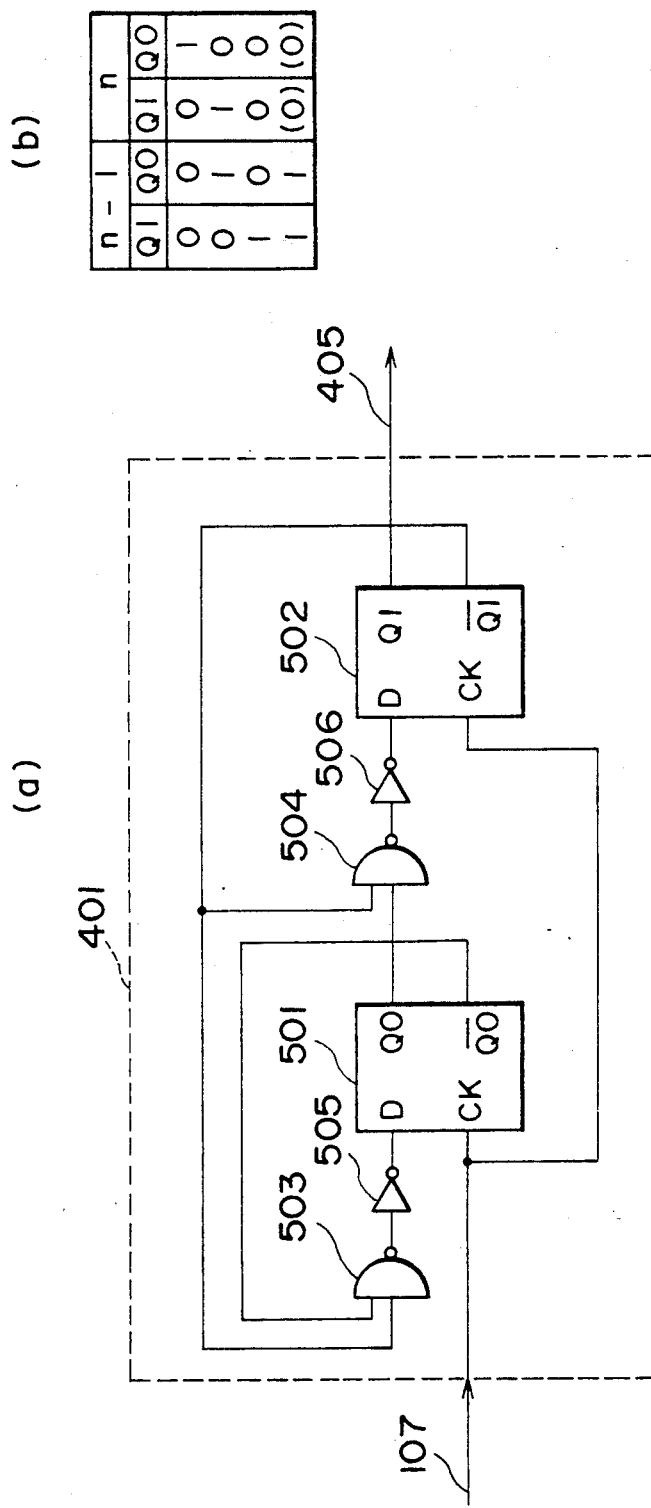

Here, a circuit for dividing the frequency by 3, which conforms to the 1-7RLLC system, will be exemplified as the frequency divider circuit 401. The arrangement of the exemplary circuit is shown in FIG. 5(a), while the truth table of the frequency division logic of this circuit is shown in FIG. 5(b). As illustrated in FIG. 5(a), the frequency divider circuit 401 includes flip-flops 501, 502; NAND gates 503, 504; and inverters 505, 506. This circuit is a counter circuit in which the output of each flip flop is fed back to the input thereof. Therefore, it needs to be designed considering a high-speed operation and requires particular attention to be paid to the number of stages of the feedback gates.

More specifically, a case will be studied which conforms to a data transfer rate of 80 Mb.p.s. in a magnetic disk storage device which is based on NRZ codes. Since a corresponding clock requires a 1.5 times higher rate, the highest frequency of the VCO clock 107 becomes 144 MHz assuming that a capture range (VCO oscillation range) of ±20% is secured.

The cycle Tw of this VCO clock 107 is about 7 ns. Since the feedback to the input must be completed in a time period shorter than the cycle Tw, the arrangement of the circuit 401 needs to satisfy the following constraint:

$$Tw > TSU + TdQ + Tdl + \ldots + Tdn$$

where TSU denotes the setup time of the flip-flop, TdQ denotes the gate delay time of the Q output of the flip flop, and Tdl Tdn denote the total gate delay time of the feedback gates. When the circuit 401 is implemented in the form of an LSI by a Bi-CMOS process realizing a gate length of 2 μm, the following holds:

$$TSU + TdQ \approx 5 \text{ ns}$$

$$Tdn \approx 1 \text{ ns}$$

Accordingly, the number of stages n of the feedback gates becomes $n \leq 2$.

Figure 6:
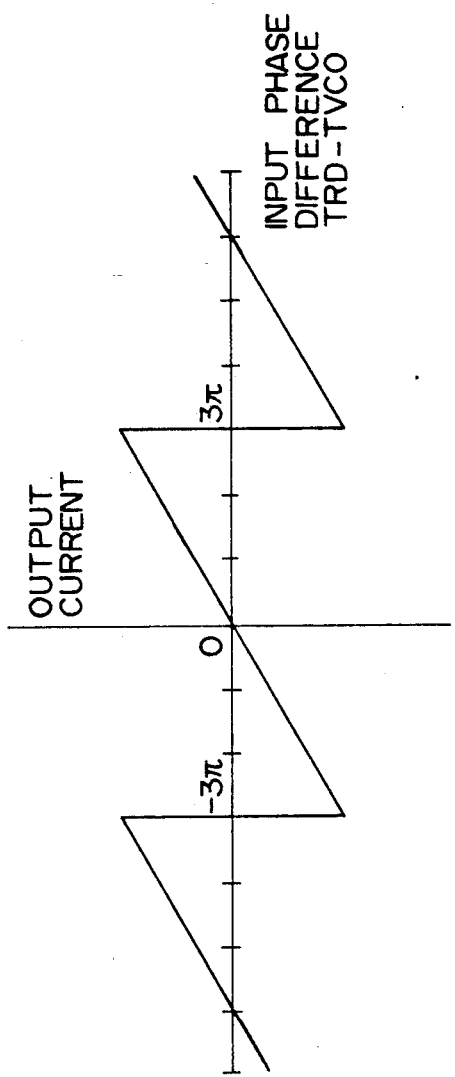
FIG. 6 is an explanatory diagram showing the phase comparison characteristics of a charge pump.

Meanwhile, FIG. 6 shows the phase comparison characteristics of the charge pump 302.

In the figure, the axis of abscissas represents the input phase difference between the data signal and the VCO clock, while the axis of ordinates represents the average output current of the charge pump.

As can be seen from the figure, according to the phase-locked loop circuit of this embodiment, the phase comparison range which is only $\pm \pi$ in a conventional phase comparator can be widened the frequency-division-ratio times (herein, 3 times). Therefore, it is difficult for a mistake to occur, and the capture range is wide.

Figure 7:
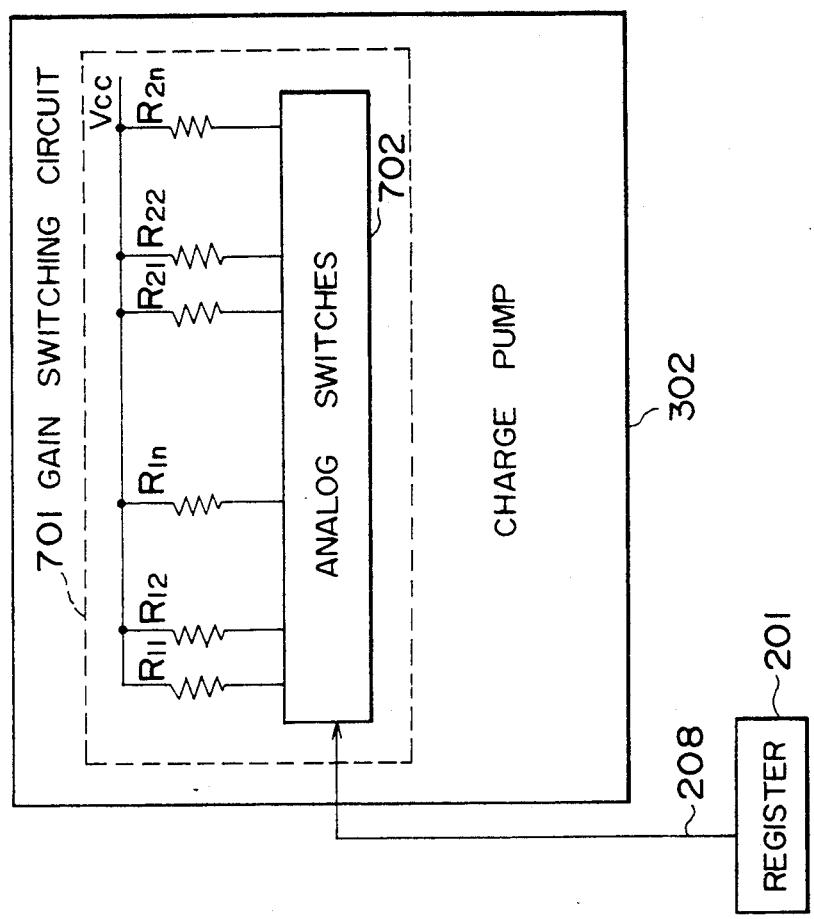
FIG. 7 is a block diagram showing the arrangement of a gain switching circuit which is included in the charge pump.

FIG. 7 shows a gain switching circuit 701 which is included in the charge pump 302 in order to switch the values of the fixed output current of this charge pump. The gain switching circuit 701 is formed of a plurality of analog switches 702, resistors R11-R1n and resistors R21-R2n. By the way, the gain of the charge pump 302 is proportional to a reference current (either an INC current or a DEC current) which is fed from the gain switching circuit 701.

The resistors R11-R1n and the resistors R21-R2n serve to set the INC side reference current and the DEC side reference current, respectively at will. Resistances numbering n are prepared in this manner, and the analog switches 702 are changed-over by the control signal 208 sent from the register 201, whereby n different reference currents are obtained on the INC side and DEC side independently of each other, and the n values of gain can be changed over.

Besides, the window margin loss becomes a problem in a case where the INC side current and the DEC side current fail to equalize due to the imbalance of the circuit, etc., with the result that an offset in the output current arises for a certain magnitude of phase difference. This situation can be easily coped with by altering the values of the resistors R11-R1n and R21-R2n, and sharply lower the window margin loss.

Figure 8:
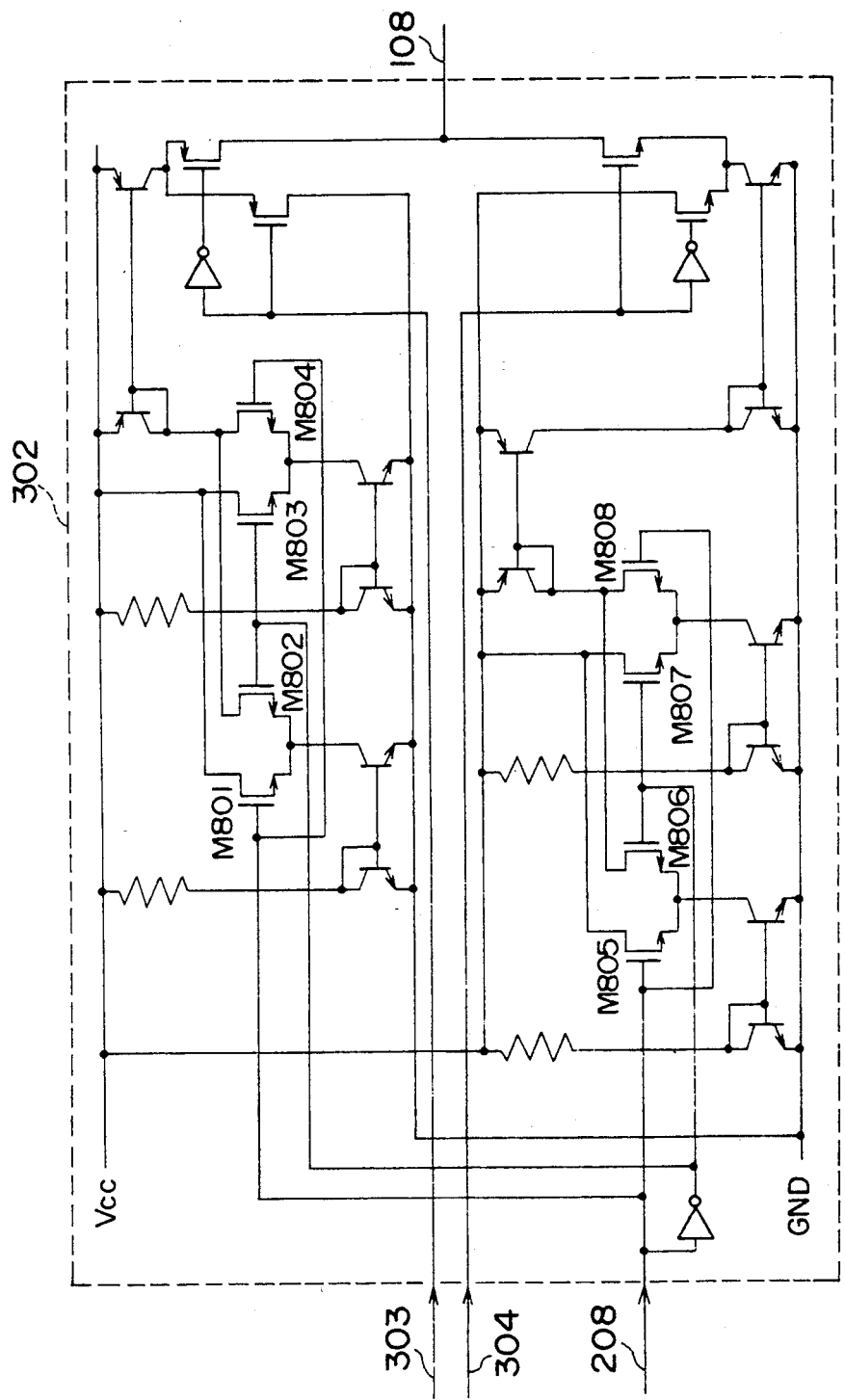
FIG. 8 is a circuit diagram showing the arrangement of the charge pump.

FIG. 8 shows an example of the internal circuit arrangement of the charge pump 302 in which the number n of gain switching stages is 2.

The stable phase-lock follow-up means 102 (refer to FIGS. 1 and 2) will now be described.

Figure 9:
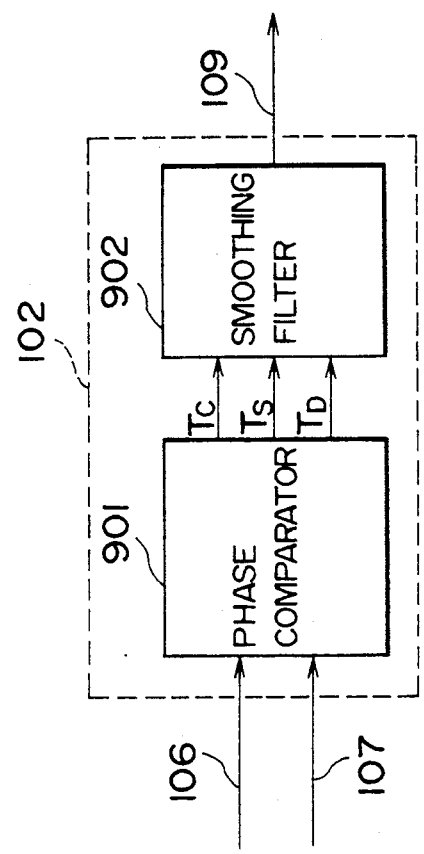
FIG. 9 is a block diagram showing the constitution of stable phase-lock follow-up means.

FIG. 9 shows the constitution of the stable phase-lock follow-up means 102.

As illustrated in the figure, this stable phase-lock follow up means 102 is comprised of a phase comparator 901 and a smoothing filter 902.

Figure 10:
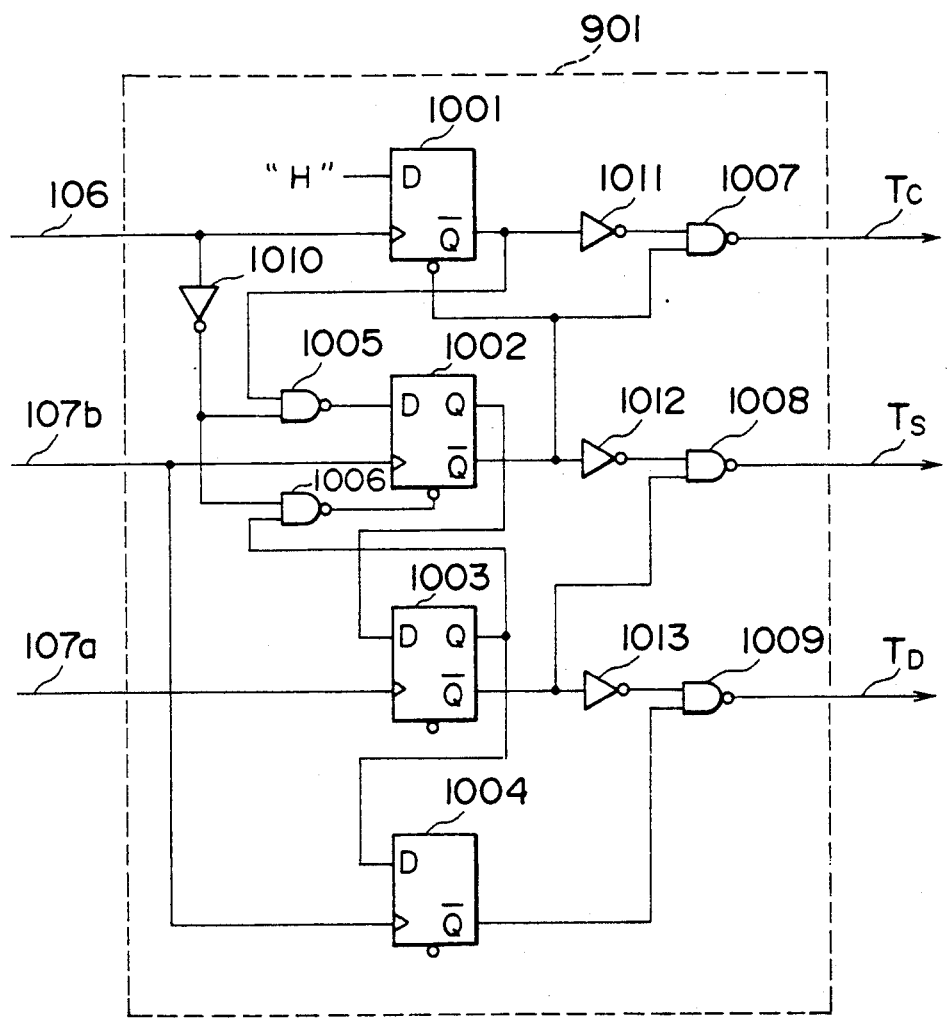
Figure 10:
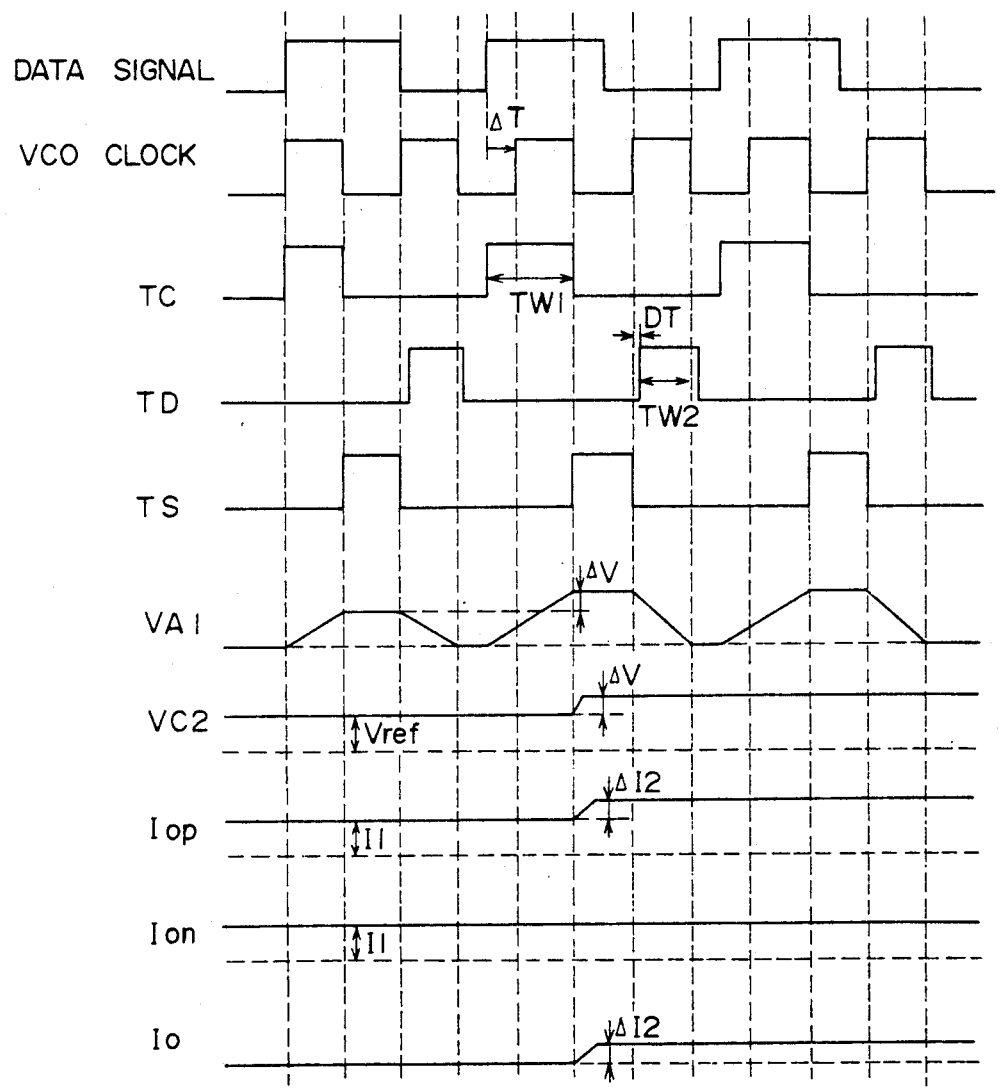

The phase comparator 901 can be realized by a circuit shown in FIG. 10(a).

This circuit produces three signals TC, TS and TD in accordance with the data signal 106, a VCO clock 107b (of negative polarity) and a VCO clock 107a (of positive polarity).

The timing chart of these signals is shown in FIG. 10(b).

Figure 11:
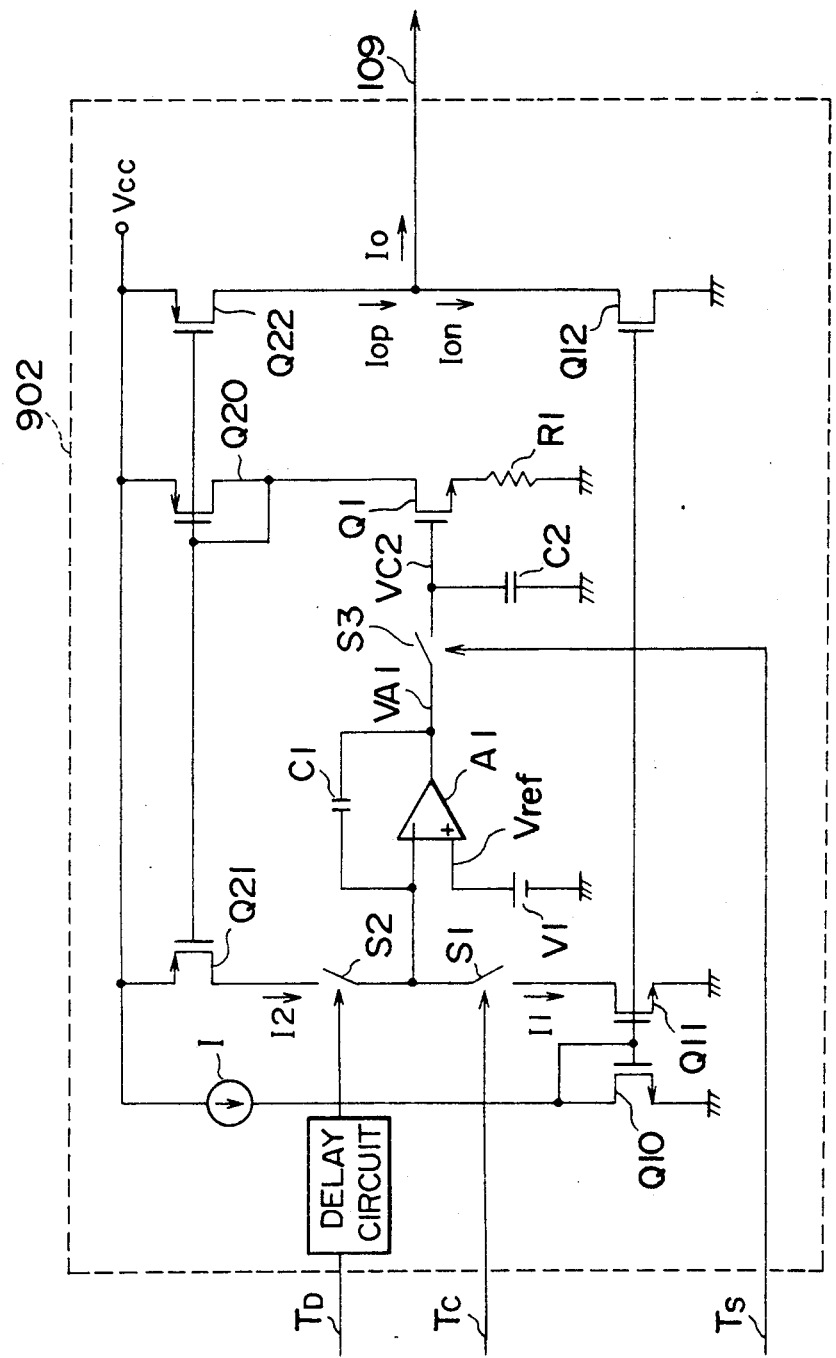
FIG. 11 is a circuit diagram showing the configuration of the smoothing filter.

The smoothing filter 902 can be realized by a circuit shown in FIG. 11.

This circuit samples and holds the signals TD, TS and TC produced by the phase comparator 901, and delivers the current 109 corresponding to a held voltage.

More specifically, the value of a voltage signal TD is sampled and held in an integrator including an operational amplifier A1, when the signal TS is active. Subsequently, the integrator is discharged in the period when the signal TC is active.

In this regard, a current 12 which discharges the integrator is determined by feeding back the sampled and held value. In the case of high-speed operation, a delay time attributable to the feedback is not negligible. In this embodiment, therefore, the signal TD is delayed in correspondence with the delay time by a delay circuit. A logical gate circuit can be employed as the delay circuit.

Unlike the output of the charge pump, the phase comparison output 109 based on the phase comparator 901 and smoothing filter 902 thus far described contains a very small ripple component and can stabilize the filter voltage. Therefore, the follow-up means 109 affords a wide lock range and attains a stability in the phase-lock follow up operation.

Figure 12:
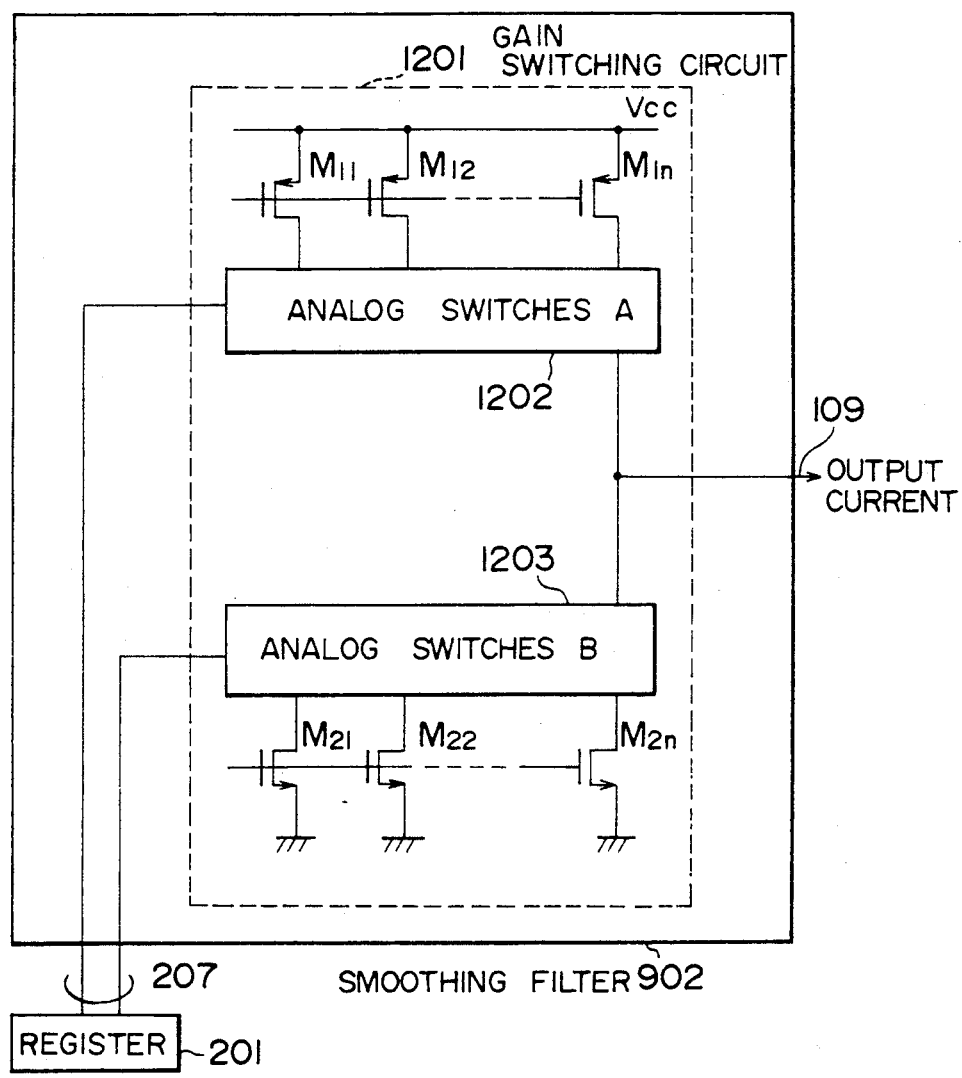
FIG. 12 is a block diagram showing the arrangement of a gain switching circuit which serves to switch the values of a fixed current being the output of the smoothing filter.

FIG. 12 shows a gain switching circuit 1201 for changing over the values of the fixed output current of the smoothing filter 902. The circuit 1201 is formed of a plurality of analog switches A at numeral 1202, a plurality of analog switches B at numeral 1203, MOS transistors M11–M1n and MOS transistors M21–M2n.

By the way, the gain of the smoothing filter 902 is proportional to a reference current (either an INC current or a DEC current) which is fed from the gain switching circuit 1201.

The MOS transistors M11–M1n and the MOS transistors M21–M2n serve to set the INC side reference current and the DEC side reference current, respectively. Owing to this scheme, the n sorts of gains can be changed-over on the INC side and DEC side independently of each other.

According to the circuit arrangement, the offset of the output current 109 can be canceled without affecting circuit operation, and the window margin can be maximized.

The loop filter 103 (refer to FIGS. 1 and 2) in this embodiment will now be described.

Figure 13:
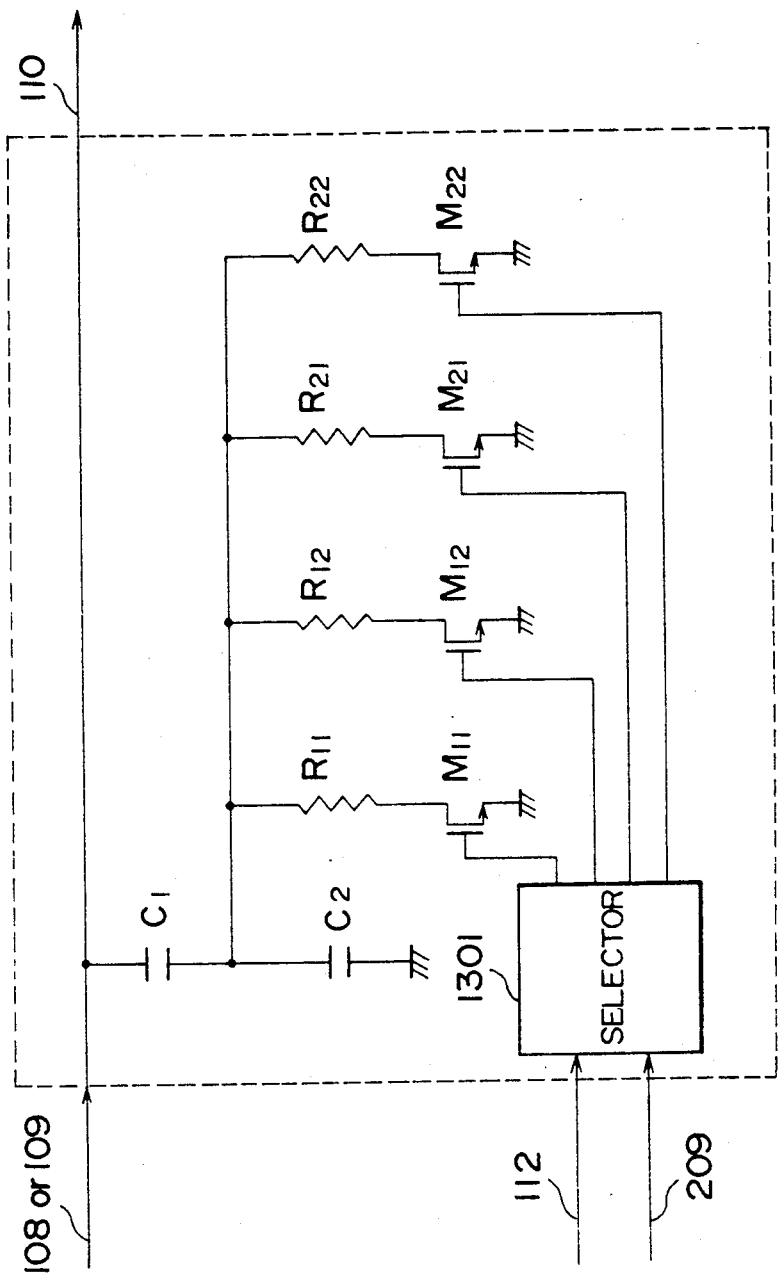

FIG. 13(a) shows the constitution of the loop filter 103.

Referring to the figure, symbols M11 thru M22 denote analog switches, which are turned ON/OFF by a selector 1301. The selector 1301 changes over the analog switches as illustrated in FIG. 13(b), in accordance with the gain switching signal 112 and the control signal 209 from the register 201.

Owing to such an operation, the optimum loop filters can be set on the inner peripheral side and outer peripheral side of the magnetic disk during the zone-bit recording which is the new recording method.

Incidentally, resistors and capacitors which constitute the loop filter 103 may well be formed as the externally-mounted circuit of the phase-locked loop IC.

Besides, the ON-resistance of each analog switch is set at 50 Ω or below in order to cope with the data transfer rate of 80 Mb.p.s.

The VCO 104 (refer to FIGS. 1 and 2) will now be described.

Figure 14:
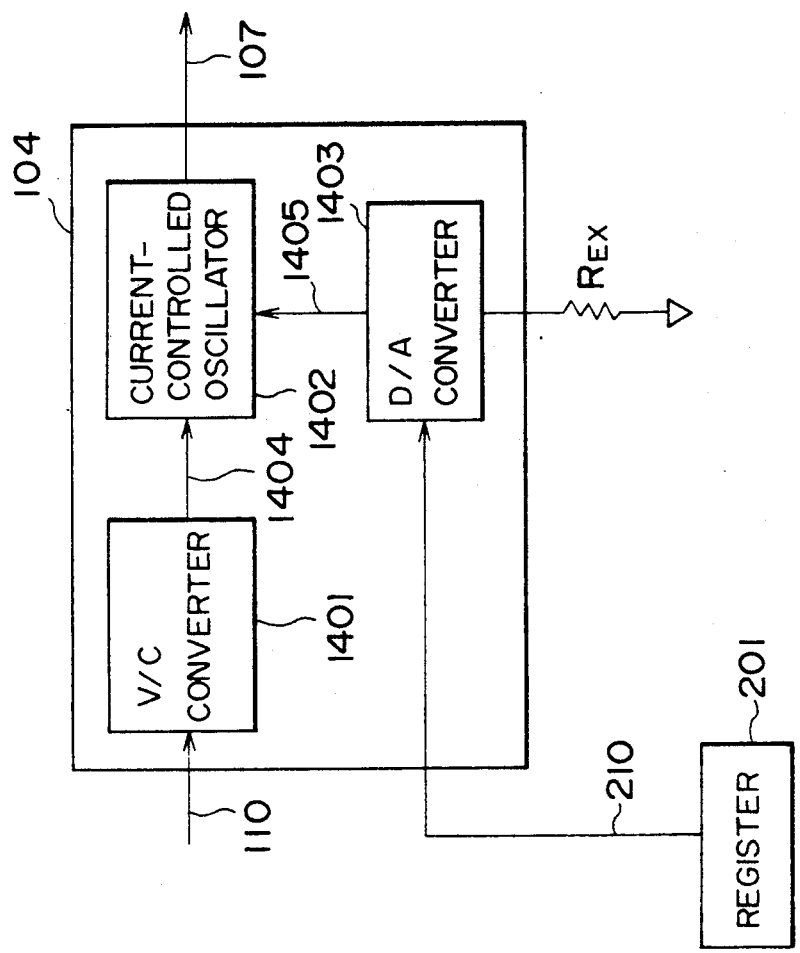
FIG. 14 is a block diagram showing the constitution of a VCO.

FIG. 14 shows the constitution of the VCO 104.

As illustrated in the figure, the VCO 104 is comprised of a voltage/current converter 1401, a current-controlled oscillator 1402 and a digital/analog converter 1403.

The control voltage 110 in the figure is input to the voltage/current converter 1401 and is converted into a control current 1404.

The control current 1404 is input to the current-controlled oscillator 1402 so as to control the frequency of the VCO clock 107.

On the other hand, the digital/analog converter 1403 generates a reference current 1405 for setting the free running frequency of the oscillator 1402, with reference to a current produced using a reference resistor REX and in accordance with the command of the control signal 210 sent from the register 201. The generated current 1405 is applied to the current controlled oscillator 1402.

By way of example, in the case of realizing the 80 Mb.p.s. transfer in the magnetic disk storage device, the VCO clock frequency to be dealt with becomes 120 MHz for the recording code system 1-7RLL, and it becomes 144 MHz in expectation of the capture range of ±20%. Accordingly, the signal levels of the data signal 106 and VCO clock 107 being such high-speed signals need to be ECL levels.

Figure 15:
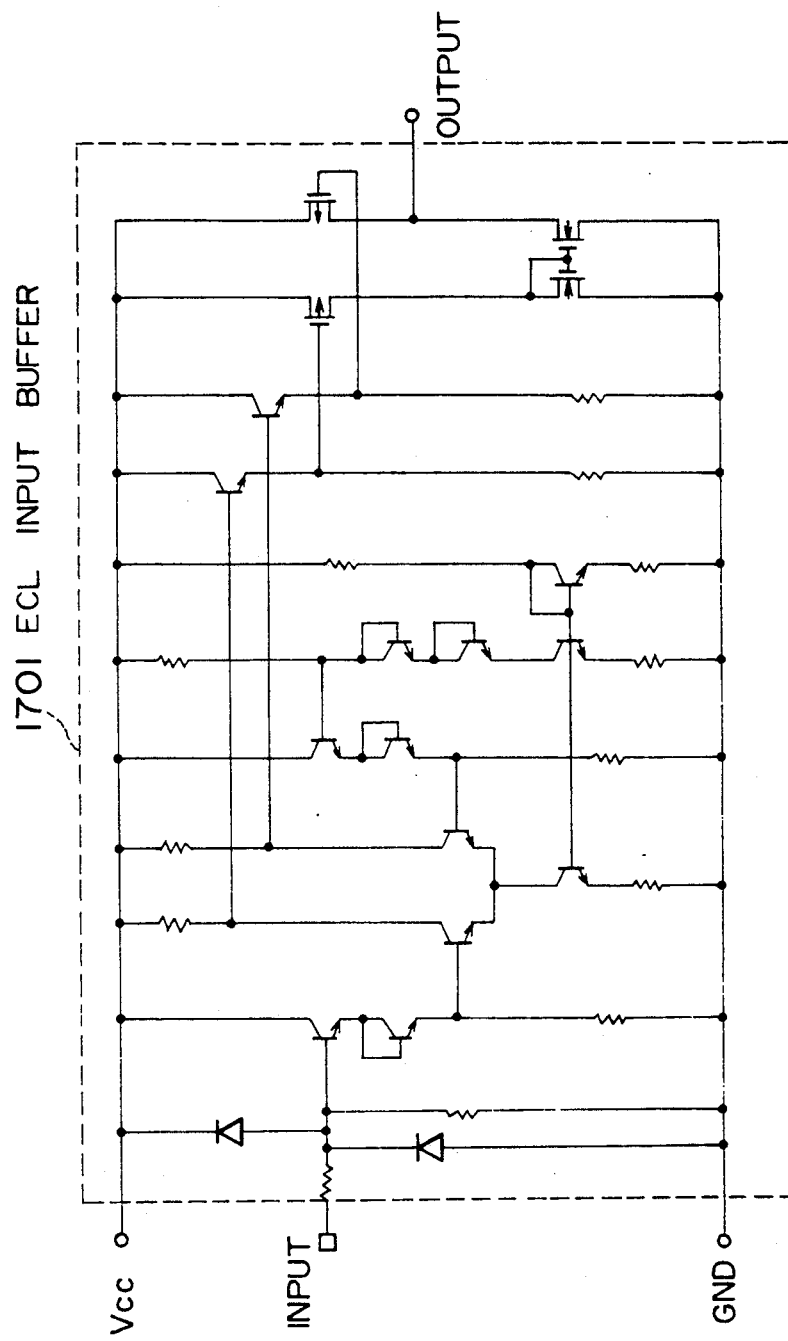
FIG. 15 is a circuit diagram showing the constitution of an ECL input buffer.
Figure 16:
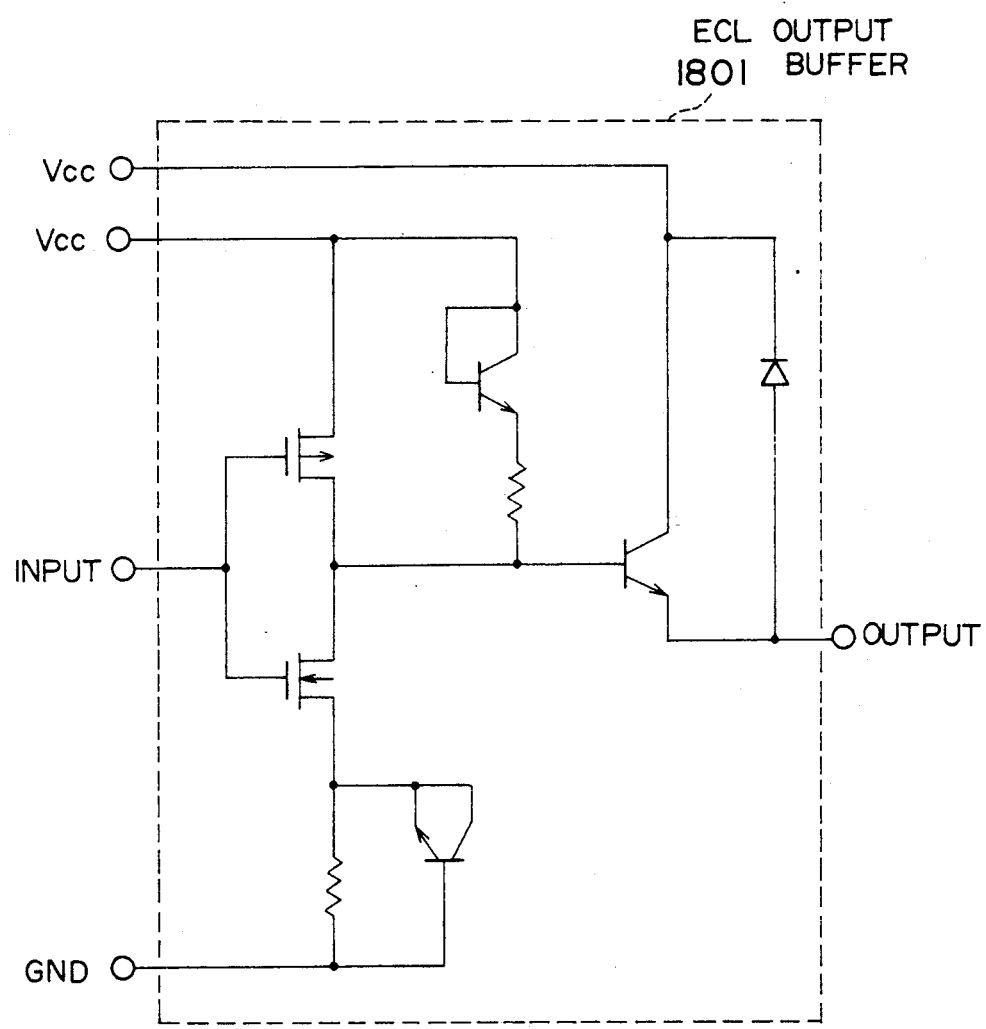
FIG. 16 is a circuit diagram showing the constitution of an ECL output buffer.

Here, the constitution of each of the ECL input buffers 113 (refer to FIG. 1) necessary for making the signal levels of the data signal 106 and VCO clock 107 ECL levels is shown in FIG. 15, while the constitution of the ECL output buffer 114 is shown in FIG. 16.

Referring to FIG. 15, the input of the ECL input buffer 1701 is of the ECL level, and the output thereof is set at a MOS level herein because it is connected to the internal circuit.

Referring to FIG. 16, the input of the ECL output buffer 1801 is of the MOS level because the output signal from the internal circuit is applied thereto, and the output thereof is an ECL level.

Meanwhile, the IC is subjected to a product test (probe test) by bringing a probe into contact therewith while still in a wafer state. As regards the ECL output buffer whose output is of small amplitude, the noise margin of the output is narrow, and it is difficult to stably measure the high VCO oscillation frequency.

Figure 17:
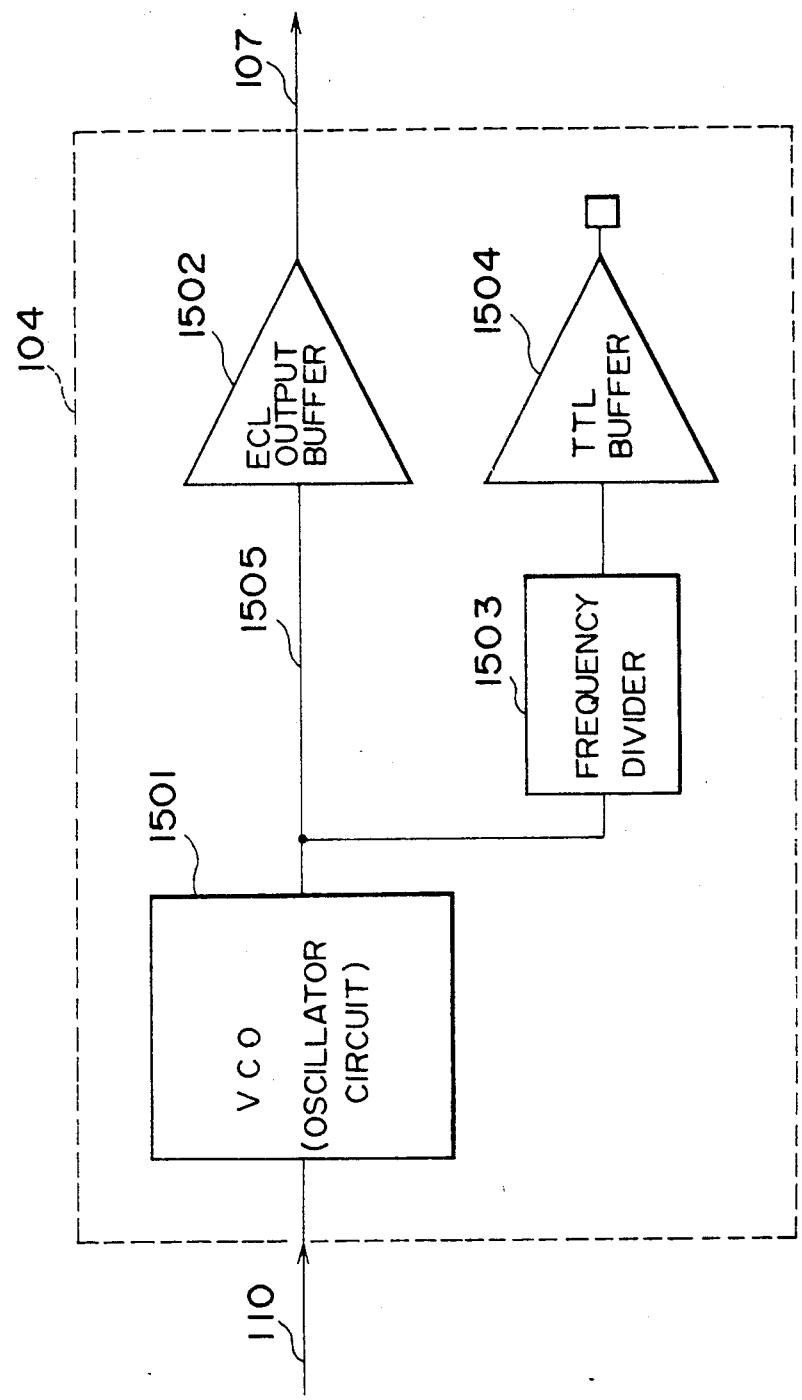
FIG. 17 is a block diagram showing a constitution which concerns a VCO output.

Therefore, the stable measurement is permitted in such a way that, as shown in FIG. 17, the high frequency is lowered by a frequency divider circuit 1503, whereupon a TTL buffer 1504 of large output amplitude is provided.

Figure 18:
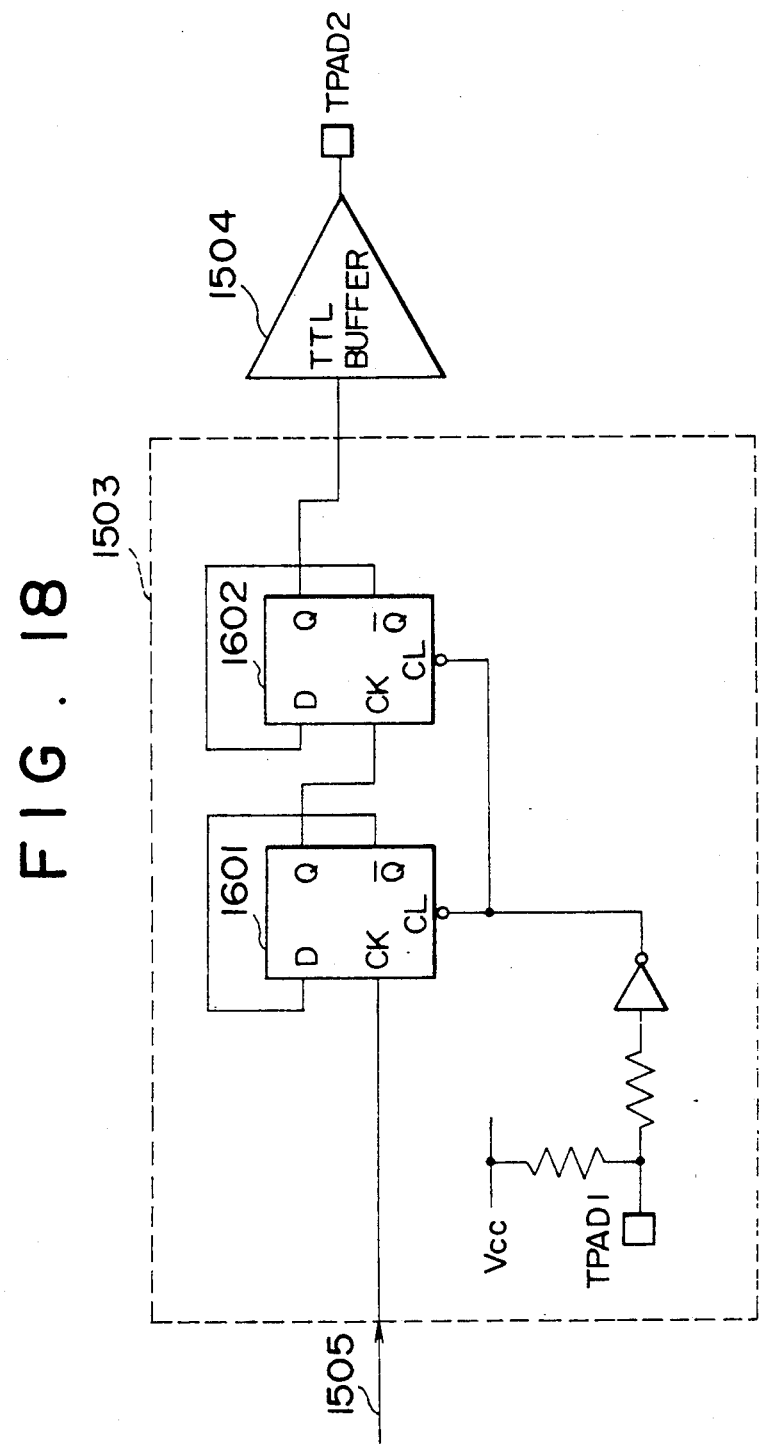
FIG. 18 is a block diagram showing the construction of a PLL in an embodiment, and containing a circuit diagram illustrative of the configuration of a frequency divider circuit for testing the VCO output.

The frequency divider circuit 1503 can be realized by a circuit shown in FIG. 18.

In the circuit depicted in FIG. 18, the frequency is divided by 4 by means of flip-flops 1601 and 1602. Thus, the VCO oscillation frequency of 120 MHz in the example of the magnetic disk storage device in which the data transfer rate is 80 Mb.p.s. can be lowered to 30 MHz. This frequency is easy to deal with even at a TTL level, and the stable frequency measurement is possible.

Besides, when the IC is subjected to the probe test, the flip-flops 1601 and 1602 can be operated by setting a test pad TPAD1 at the "L" level, so that the VCO clock at the divided frequency is delivered to a test pad TPAD2.

When the IC is not subjected to the probe test, the pad TPAD1 is open, and the frequency divider circuit 1503 does not operate, so that no increase in power consumption is incurred. Moreover, since the pads TPAD1 and TPAD2 are used only for the probe test, no pin output is required, and hence, the number of pins is not increased by this circuit.

Meanwhile, when the various circuit blocks described above are to be integrated in a single semiconductor chip, the mutual interferences among the circuits are obstructive to the enhancement in operating speed.

It is therefore important to suppress as far as possible jitter effects caused by the circuit interferences, for example, the jitter of the VCO clock and that of the PLL.

Especially in reducing these jitter effects, the layout of the circuits, methods of wiring and feeding supply voltages, how to take ground (hereinbelow, abbreviated to "GND") points, etc. become problematic.

Figure 19:
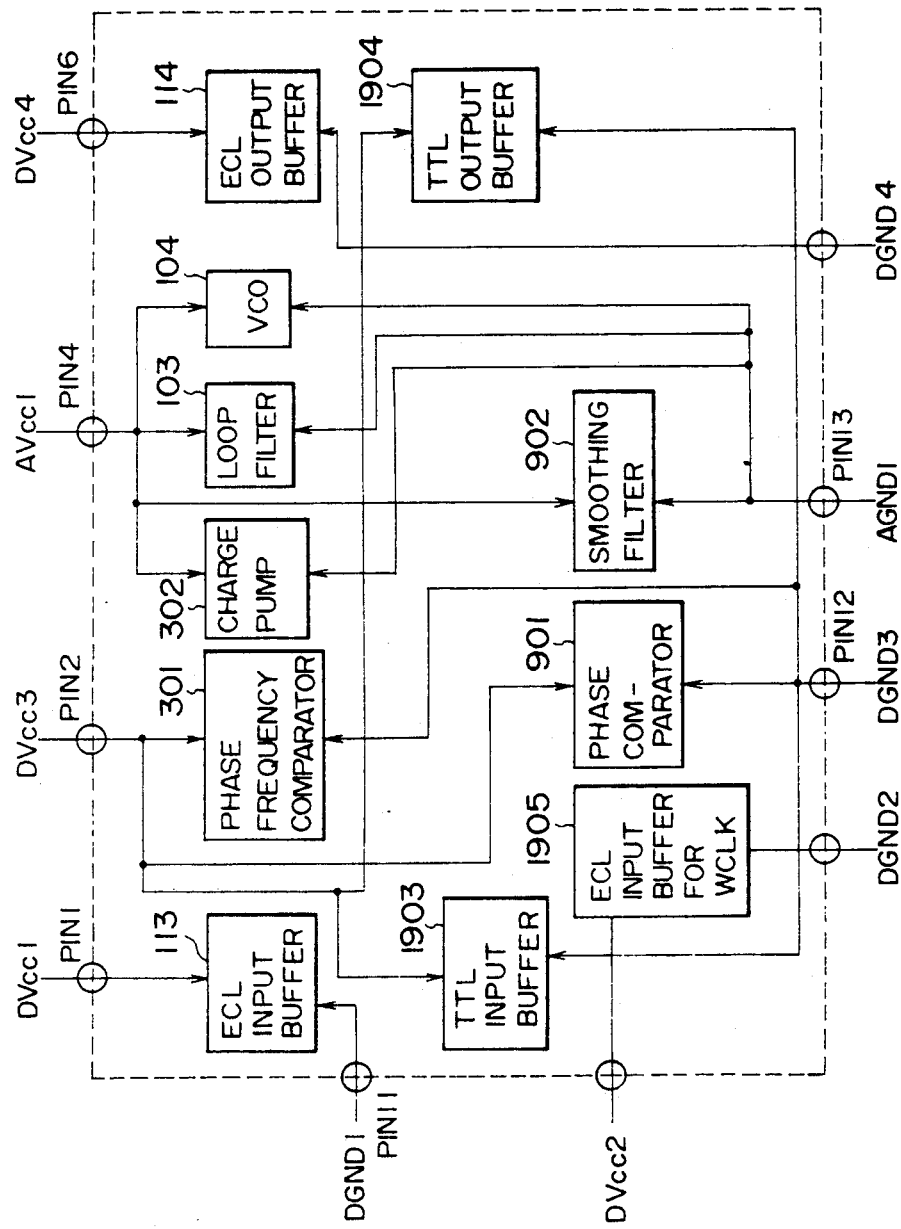
FIGS. 19 and 20 are block diagrams each showing a method of feeding supply voltages and a ground potential to various circuit blocks in the phase-locked loop IC.

Here, FIG. 19 shows the relationship of the supply voltage feed and the GND points to the circuit blocks of the phase-locked loop IC in this embodiment.

By the way, since the read gate signal 111 and gain switching signal 112 are the control signals and need not be very rapid, they are set at TTL levels, and a TTL input buffer 1903 and a TTL output buffer 1904 are provided therefor.

As illustrated in FIG. 19, in this embodiment, the supply voltages and the GND points are isolated for the analog type circuits (VCO 104, loop filter 103, charge pump 302, smoothing filter 902), digital type circuits (phase frequency comparator 301, phase comparator 901, TTL input buffer 1903, TTL output buffer 1904), the ECL input buffers 113, and the ECL output buffer 114.

In the example depicted in FIG. 19, the number of supply voltage feed pins is 5, and the number of GND potential pins is also 5. However, these numbers are not restrictive, but the supply voltages of the respective systems must be kept isolated.

Figure 20:
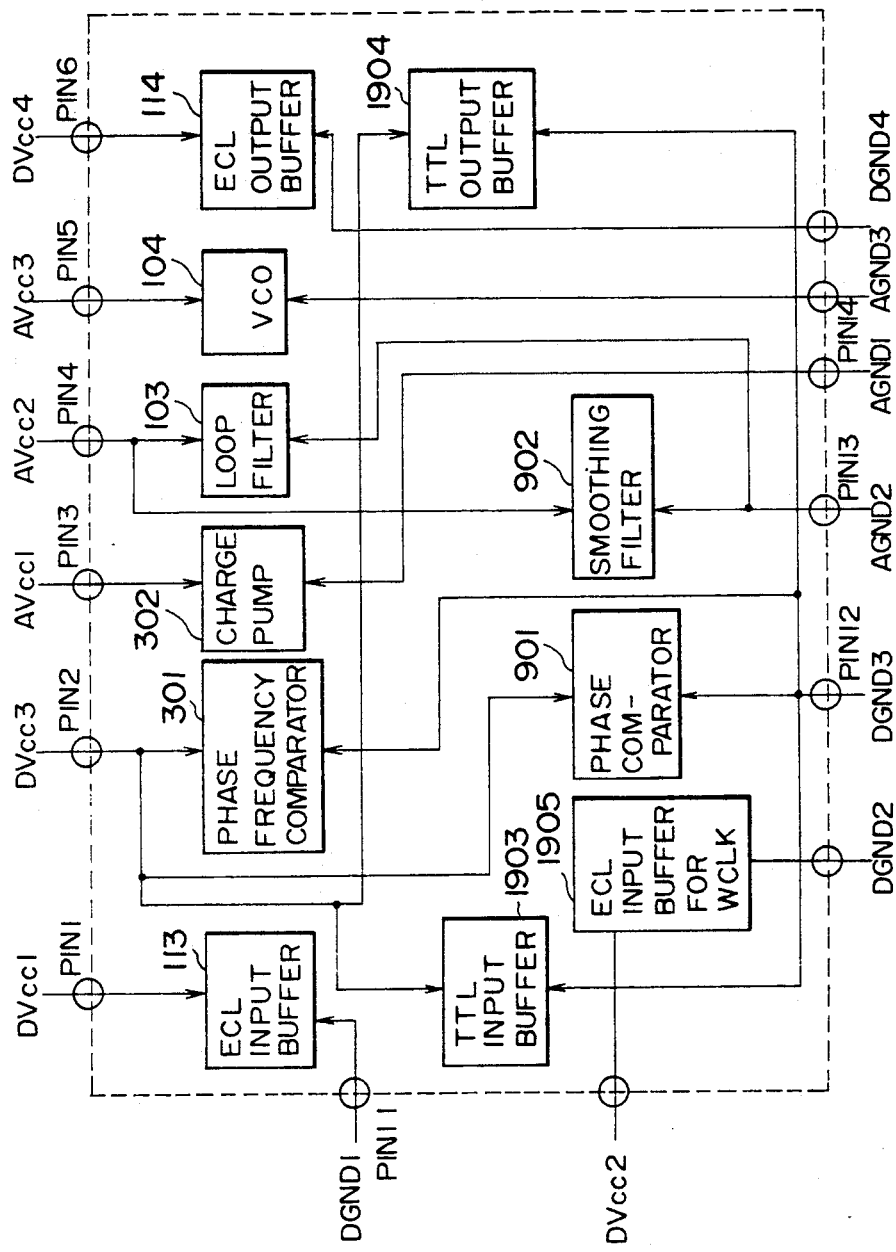

Alternatively, the supply voltages and the GND points may well be secured as shown in FIG. 20.

Unlike the scheme shown in FIG. 19, the scheme shown in FIG. 20 is such that the supply voltages and GND points of the VCO 104, charge pump 302 and smoothing filter 902 are isolated independently of one another.

If possible, it is desirable that the supply voltages and GND points of the ECL input buffers 113 are independent of each other. However, when this wiring is impossible due to, e.g., the limitation of the number of pins of the IC, the GND point of the ECL output buffer 114 may well be made common with that of the digital type circuits of the TTL buffers etc. The reason therefor is that, since the output level of the ECL output buffer 114 is determined by the level of the supply voltage, it is barely affected by the common GND wiring.

Figure 21:
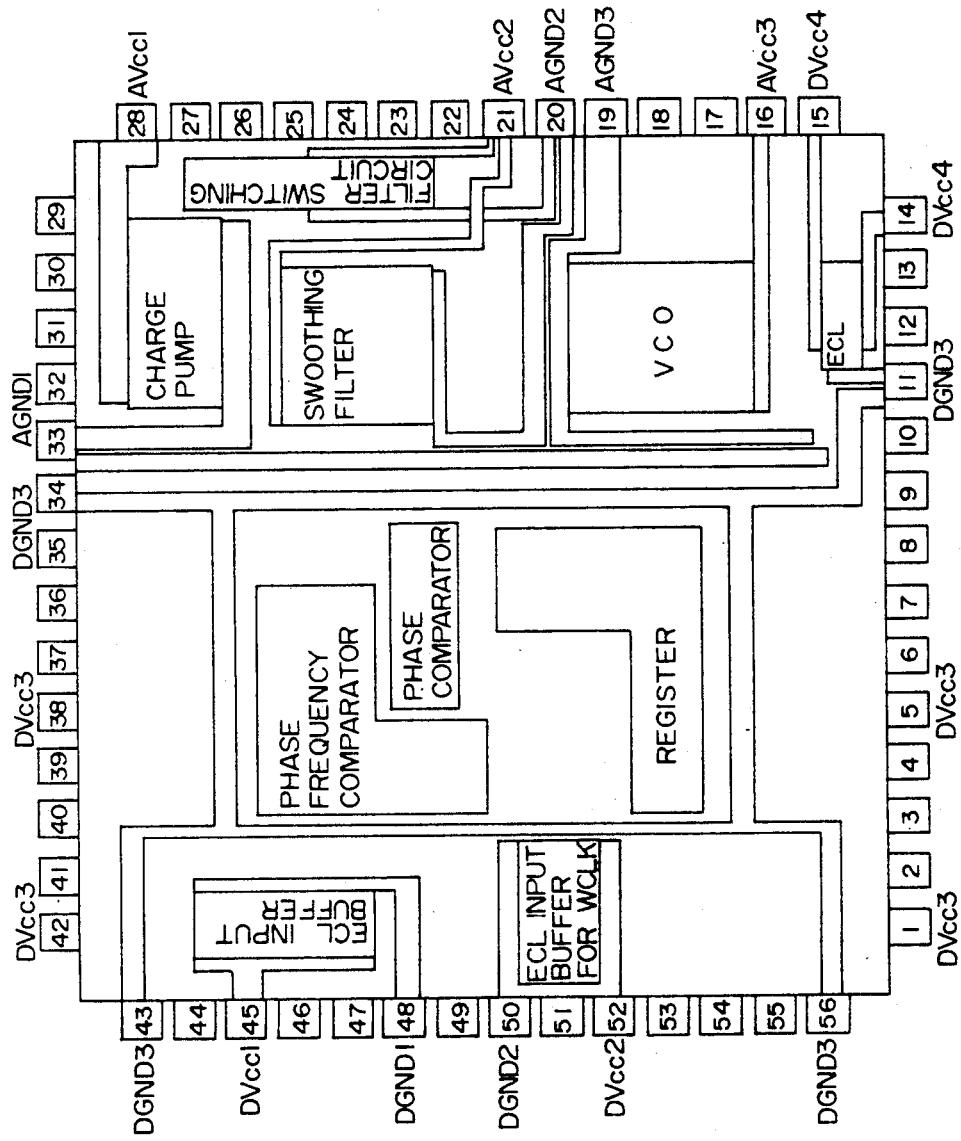
FIG. 21 is an explanatory diagram showing an example layout of the phase-locked loop IC.

An example of layout based on this scheme is shown in FIG. 21. This layout illustrates the phase locked loop IC in which the resistors and capacitors constituting the loop filter 103 are externally mounted with only the switching circuit of the filter 103 built in.

Further, when even this scheme is impossible, the supply voltages and GND points of the ECL input buffers 113 may well be respectively made common with those of the digital type circuits as an alternative expedient.

The reason therefor is that, according to the phase-locked loop circuit in this embodiment, the digital logic quantity thereof is not very large as described before, so the ECL input buffers will only be slightly affected by the common wiring with the digital type circuits.

By the way, an input buffer for WCLK is shown at numeral 1905 in each of FIGS. 19 and 20. As will be described later, in a case where the phase locked loop IC in this embodiment is fabricated as a phase-locked loop IC for a magnetic disk storage device, the buffer 1905 is used for affording a write clock as an input instead of the data signal except in the data read process.

The above embodiments have been described as pertaining to the phase-locked loop ICs of the type in which the VCO clock 107 is first output from the IC and is then re-input again to the IC.

Next, phase-locked loop ICs in another aspects will be described.

Figure 22:
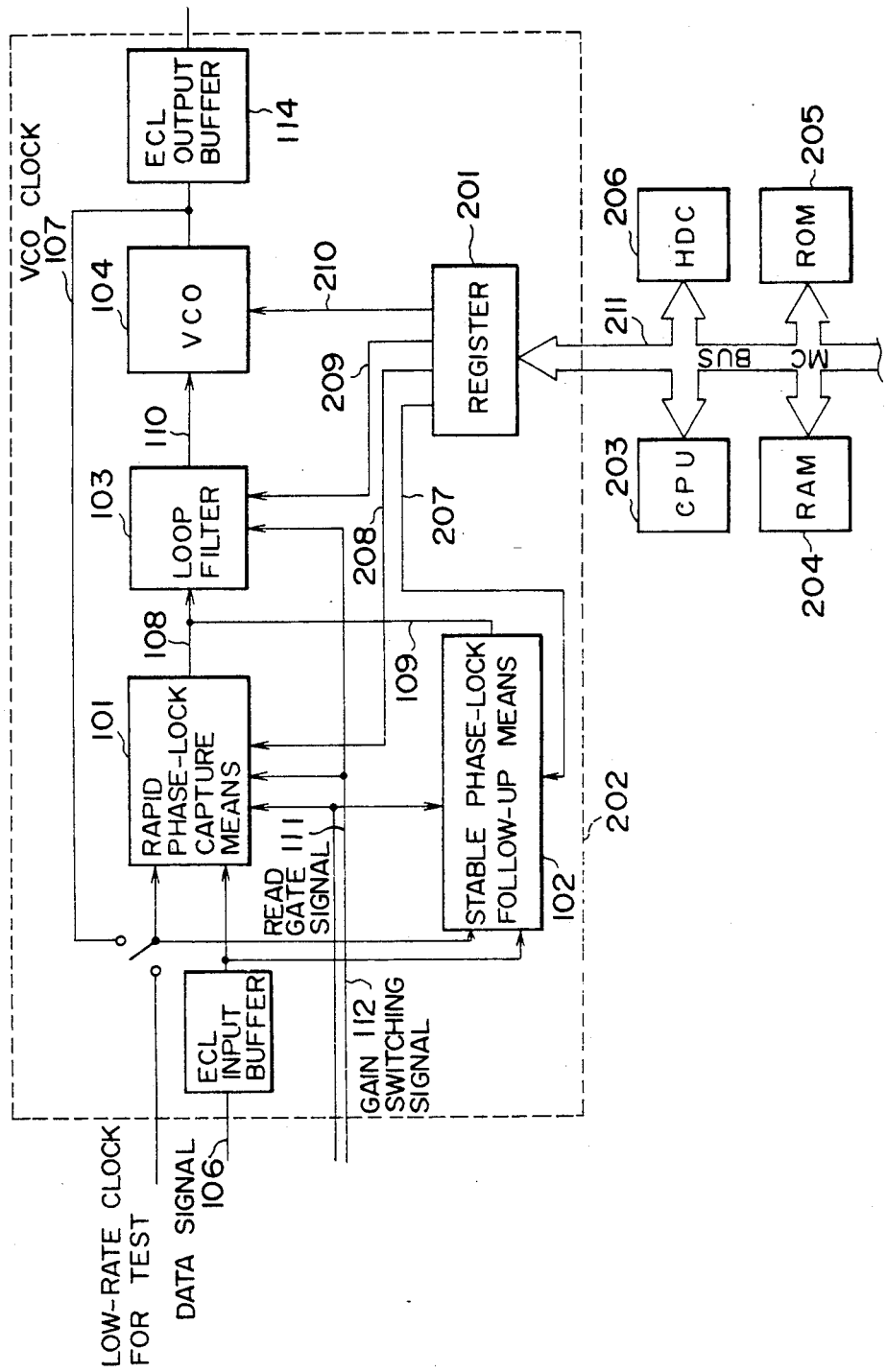
FIGS. 22 and 23 are block diagrams each showing another construction of the phase-locked loop IC.

According to the IC shown in FIG. 22, the VCO clock 107 is fed back within the IC.

In this case, the ECL input buffer for the VCO clock 107 is dispensed with. By the way, in the illustrated example, a clock for a test can be input instead of the VCO clock.

Figure 23:
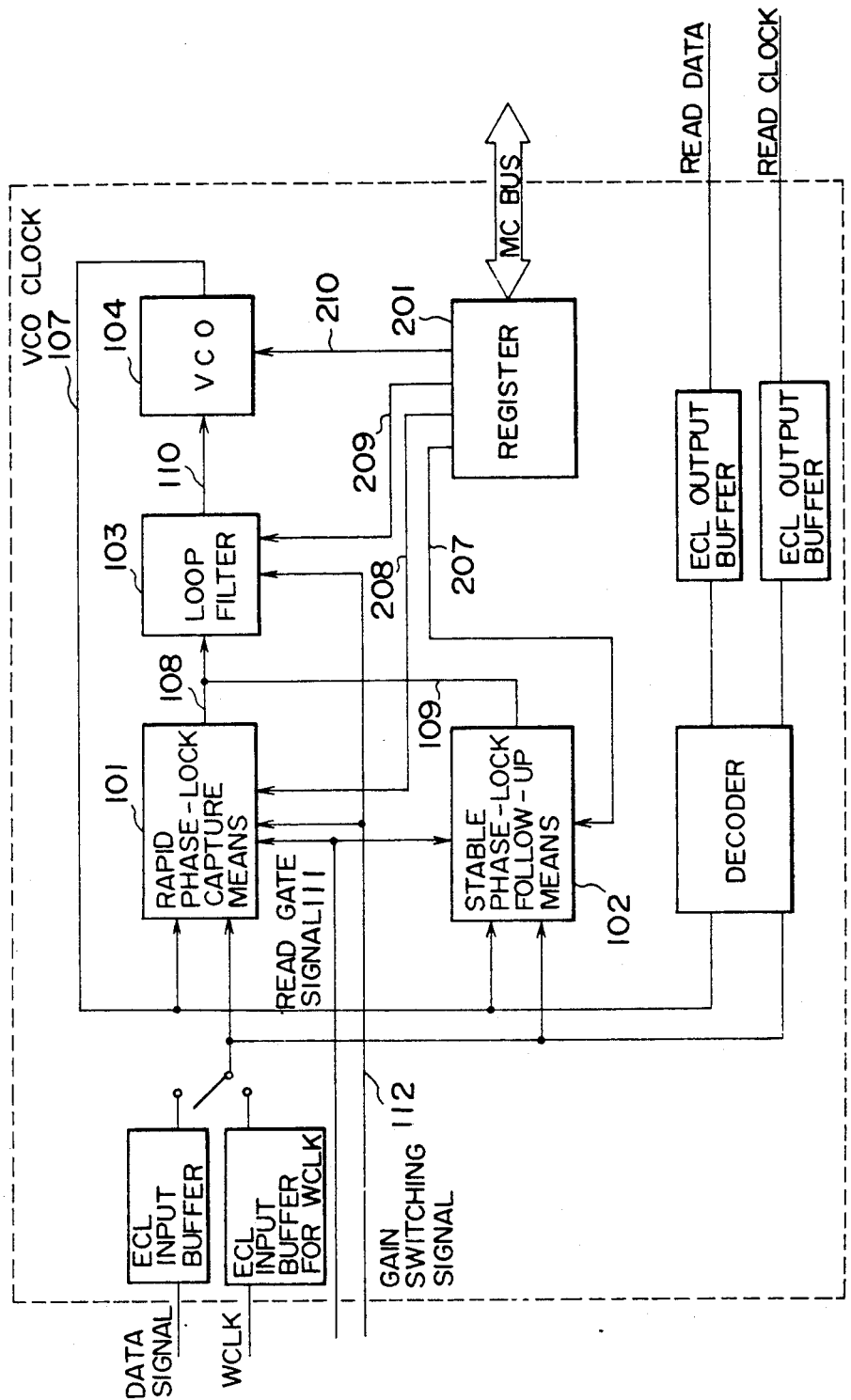

FIG. 23 shows the phase-lacked loop IC for the magnetic disk storage device, in which a decoder circuit is built.

In this case, the VCO clock 107 need not be output, so the ECL input buffer and ECL output buffer for the VCO clock 107 are dispensed with. However, ECL output buffers for delivering decoded read data and a read clock synchronized therewith are required. In addition, an input terminal for the WCLK signal and an ECL input buffer for WCLK are provided, whereby the WCLK signal can be changed-over from the data signal and input to the phase locked loop circuit.

Incidentally, as in the IC shown in FIG. 22, a clock for a test may well be permitted to enter the IC in FIG. 23 instead of the VCO clock.

Here will be described the operation of inputting the write clock by the use of the aforementioned ECL input buffer for WCLK.

In the case where the phase-locked loop IC in this embodiment is applied to the magnetic disk storage device, it generates the clock synchronized with the data from a magnetic disk and is used when reading out the data.

In consequence, however, no input is applied to the phase-locked loop circuit during the write operation of the magnetic disk storage device. Then, the oscillation frequency of the VCO deviates greatly, and the recapture of the VCO output becomes difficult at the start of the next read operation.

In this embodiment, therefore, the write clock for the write operation, having the same frequency as that of the read operation, is input so as to maintain the VCO at this frequency during the write operation.

By the way, in a case where the transfer rate of the data from the magnetic disk has a fixed value, a fixed frequency signal from an included oscillator may well be input instead of the write clock. With this example, however, a plurality of oscillators must be provided for the case of adopting the zone-bit recording method in which the transfer rate differs depending an the radial position of data or the disk.

In the case of adopting the zone-bit recording, accordingly, it is more desirable to afford the write clock as the input. On this occasion, during a seek operation before the start of reading data, the write clock corresponding to the transfer frequency of the zone concerned is input.

Figure 24:
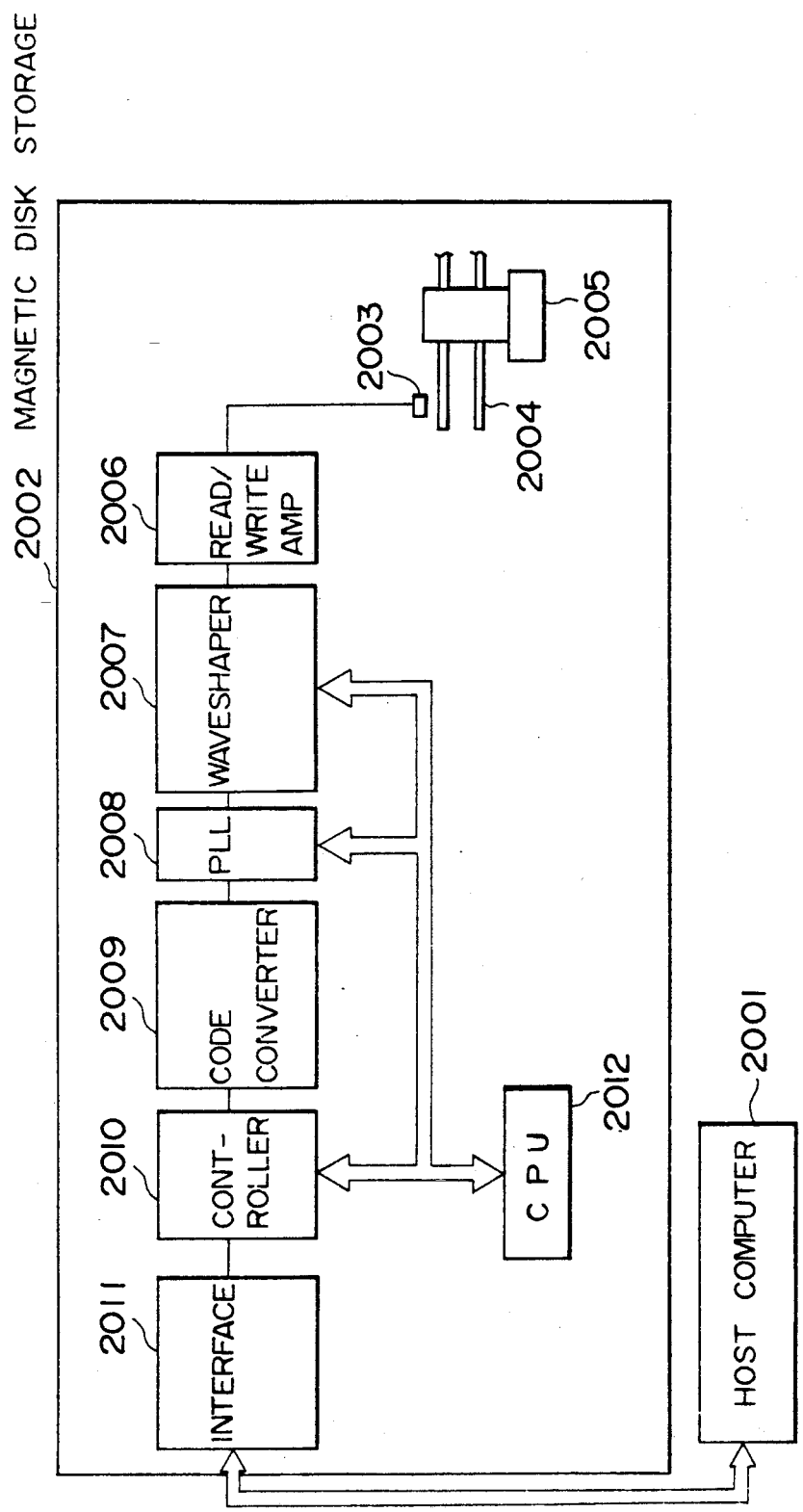
FIG. 24 is a block diagram showing the architecture of an information processing system in which the phase-locked loop IC is adopted for a magnetic disk storage device.
Figure 25:
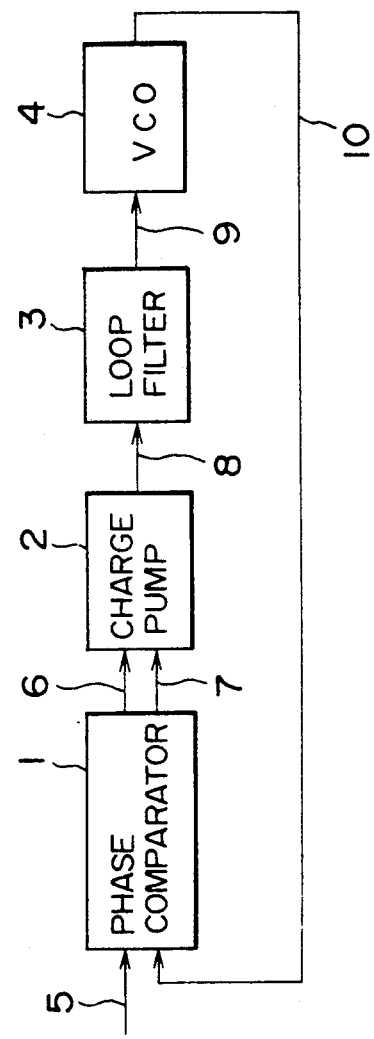
FIG. 25 is a block diagram showing the construction of a phase-locked loop circuit in the prior art.

Next, FIG. 24 shows the architecture of an information processing system which is furnished with a magnetic disk storage device employing the phase-locked loop circuit in this embodiment.

The system is constructed of a host computer 2001 and the magnetic disk storage 2002. The magnetic disk storage 2002 includes a magnetic disk 2004, a controller 2010 for controlling the magnetic disk, a magnetic head 2003 a read/write amplifier 2006 for amplifying a read signal from the magnetic head, a waveshaper 2007 for shaping the waveform of the amplified signal, the PLL 2008, a code converter 2009, and a CPU 2012 for controlling the entire storage system. Numeral 2005 indicates a spindle motor, and numeral 2011 an interface. According to the phase-locked loop IC of the embodiment thus far described, in a case where the data read out of the storage medium is a data signal to be synchronized, by way of example, a capture range of at least ±5% and a lock range of at least ±5%, can be secured at a data transfer rate of 40 Mb. p. s.–80 Mb. p. s., and the phase locked loop circuit capable of operating stably at high speed can be provided. More specifically, even when the data signal and the VCO clock are respectively centered at the highest frequency of 40 MHz and 160 MHz under the condition of the data transfer rate of 80 Mb. p.s., the capture range of at least ±5%, and the lock range of at least ±5%, can be secured, and the phase-locked loop circuit can operate stably at high speed.

Accordingly, even in a case where the recording code system of the storage is the 1-7RLL system, the data signal in the follow-up operation and the VCO clock are respectively centered at the frequency of 4–30 MHz and the highest frequency of 120 MHz at the data transfer rate of 40 Mb. p. s.–80 Mb. p. s. Therefore, the capture range and the lock range of at least ±5%, can be secured, and the phase-locked loop circuit can operate stably at high speed.

Also, even in a case where the recording code system of the storage is the 2-7RLL system, the data signal in the follow-up operation and the VCO clock are respectively centered at the frequency of 5–26.6 MHz and highest frequency of 160 MHz at the data transfer rate 40 Mb. p. s.–80 Mb. p. s. Therefore, the capture range and the lock range of at least ±5%, can be secured, and the phase-locked loop circuit can operate stably at high speed.

As described above, according to the present invention, a phase-locked loop IC capable of conforming to a higher data transfer rate can be provided.

What is claimed is:

1. A phase-locked loop IC comprising:
   a voltage-controlled oscillator which generates a clock signal being an output signal at a frequency corresponding to a control voltage;
   a first ECL input buffer which is an input buffer for a signal to be synchronized being a signal of ECL level applied from outside said IC;
   phase-lock capture means for producing a current in accordance with the phase difference and the frequency difference between the clock signal and the signal to be synchronized passed through said first ECL input buffer, the current determining a value of the control voltage of said voltage-controlled oscillator so that the phase and frequency of the clock signal may be respectively equalized to the phase and frequency of the signal to be synchronized; and
   phase-lock follow-up means for producing a current in accordance with the phase difference between the clock signal and the signal to be synchronized passed through said first ECL input buffer, the current determining a value of the control voltage of said voltage-controlled oscillator so that the phase of the clock signal may follow up the phase of the signal to be synchronized;
   wherein an external supply voltage terminal is connected to that supply voltage system of said first ECL input buffer which is electrically isolated from any of the supply voltage systems of said voltage-controlled oscillator, said phase-lock capture means, or said phase-lock follow-up means, while an external ground terminal is connected to that ground system of said first ECL input buffer which is electrically isolated from any of the ground systems of said voltage-controlled oscillator, said phase-lock capture means, or said phase-lock follow-up means.

2. A phase-locked loop IC comprising:
   a voltage-controlled oscillator which generates a clock signal being an output signal at a frequency corresponding to a control voltage;
   a first ECL input buffer which is an input buffer for a signal to be synchronized being a signal of ECL level applied from outside said IC;
   a phase frequency comparator which delivers a timing signal corresponding to the phase difference and the frequency difference between the clock signal and the signal to be synchronized passed through said first ECL input buffer, as well as a charge pump which produces a current corresponding to the timing signal delivered by said phase frequency comparator; and
   a phase comparator which delivers a timing signal corresponding to the phase difference between the clock signal and the signal to be synchronized passed through said first ECL input buffer, as well as a smoothing filter which produces a current corresponding to the timing signal delivered by said phase comparator;
   wherein a supply voltage system of said first ECL input buffer is so disposed as to be electrically isolated at least from any of the supply voltage systems of said voltage-controlled oscillator, said charge pump, and said smoothing filter, while a ground system of said first ECL input buffer is so disposed as to be electrically isolated at least from any of the ground systems of said voltage controlled oscillator, said charge pump, and said smoothing filter.

3. A phase-locked loop IC as defined in claim 2, further comprising an ECL output buffer which delivers the clock signal as a signal of ECL level from said IC;
   wherein a supply voltage system of said ECL output buffer is so disposed as to be electrically isolated at least from any of the supply voltage systems of said voltage-controlled oscillator, said charge pump, said smoothing filter, said first ECL input buffer, said phase frequency comparator, and said phase comparator, while a ground system of said ECL output buffer is so disposed as to be electrically isolated at least from any of the ground systems of said voltage-controlled oscillator, said charge pump, said smoothing filter, and said first ECL input buffer.

4. A phase-locked loop IC as defined in claim 3, further comprising a second ECL input buffer which receives the clock signal being the signal of ECL level from outside said IC, and which delivers a clock signal for said phase frequency comparator and said phase comparator;
   wherein a supply voltage system of said second ECL input buffer is so disposed as to be eletrically isolated at least from any of the supply voltage systems of said voltage-controlled oscillator, said charge pump, said smoothing filter, and said output buffer, while a ground system of said second ECL input buffer is so disposed as to be electrically isolated at least from any of the ground systems of said voltage controlled oscillator, said charge pump, said smoothing filter, and said output buffer.

5. A phase-locked loop IC as defined in claim 2, wherein said supply voltage system of said first ECL input buffer is so disposed as to be isolated from the supply voltage system of said phase frequency comparator, and the supply voltage system of the phase comparator, while said ground system of said first ECL input buffer is so disposed as to be isolated from the ground system of said phase frequency comparator, and the ground system of said phase comparator.

6. A phase-locked loop IC as defined in claim 3, wherein said supply voltage system of said first ECL input buffer is so disposed as to be isolated from said supply voltage system of said phase frequency comparator, and said supply voltage system of said phase comparator, while said ground system of said first ECL input buffer is so disposed as to be isolated from the ground system of said phase frequency comparator, and the ground system of said phase comparator.

7. A phase locked loop IC as defined in claim 4, wherein said supply voltage system of said first ECL input buffer and said supply voltage system of said second ECL input buffer are so disposed as to be isolated from said supply voltage system of said phase frequency comparator, and said supply voltage system of said phase comparator, while said ground system of said first ECL input buffer and said ground system of said second ECL input buffer are so disposed as to be isolated from the ground system of said phase frequency comparator, and the ground system of said phase comparator.

8. A phase-locked loop IC as defined in claim 3, wherein said ground system of said ECL output buffer is so disposed as to be isolated from the ground system of said phase frequency comparator, and the ground system of said phase comparator.

9. A phase-locked loop IC as defined in claim 4, wherein said ground system of said ECL output buffer is so disposed as to be isolated from the ground system of said phase frequency comparator, and the ground system of said phase comparator.

10. A phase-locked loop IC as defined in claim 7, wherein said ground system of said ECL output buffer is so disposed as to be isolated from said ground system of said phase frequency comparator, and said ground system of said phase comparator.

11. A phase-locked loop IC as defined in claim 2, further comprising at least one switch means selected from among first switch means for switching output current levels of said charge pump, second switch means for switching output current levels of said smoothing filter, and third switch means for switching loop filters which are externally-mounted circuits of said phase-locked loop IC and by each of which either of an output current of said smoothing filter or an output current of said charge pump is converted into the control voltage of said voltage-controlled oscillator corresponding to the output current; and a register in which commands for the switching operations of the comprised switch means are stored.

12. A phase-locked loop IC as defined in claim 3, further comprising at least one switch means selected from among first switch means for switching output current levels of said charge pump, second switch means for switching output current levels of said smoothing filter, and third switch means for switching loop filters which are externally-mounted circuits of said phase locked loop IC and by each of which either of an output current of said smoothing filter or an output current of said charge pump is converted into the control voltage of said voltage controlled oscillator corresponding to the output current; and a register in which commands for the switching operations of the comprised switch means are stored.

13. A phase-locked loop IC as defined in claim 5, further comprising at least one switch means selected from among first switch means for switching output current levels of said charge pump, second switch means for switching output current levels of said smoothing filter, and third switch means for switching loop filters which are externally-mounted circuits of said phase locked loop IC and by each of which either of an output current of said smoothing filter or an output current of said charge pump is converted into the control voltage of said voltage-controlled oscillator corresponding to the output current; and a register in which commands for the switching operations of the comprised switch means are stored.

14. A phase-locked loop IC as defined in claim 2, further comprising a frequency divider which divides the frequency of the clock signal, whereupon said phase frequency comparator delivers the timing signal corresponding to the phase difference and the frequency difference between the divided-frequency clock signal and the signal to be synchronized passed through said first ECL input buffer, while the phase comparator delivers the timing signal corresponding to the phase difference between the undivided-frequency clock signal and the signal to be synchronized passed through said first ECL input buffer.

15. A phase-locked loop IC as defined in claim 3, further comprising a frequency divider which divides the frequency of the clock signal, whereupon said phase frequency comparator delivers the timing signal corresponding to the phase difference and the frequency difference between the divided-frequency clock signal and the signal to be synchronized passed through said first ECL input buffer, while said phase comparator delivers the timing signal corresponding to the phase difference between the undivided-frequency clock signal and the signal to be synchronized passed through said first ECL input buffer.

16. A phase-locked loop IC as defined in claim 5, further comprising a frequency divider which divides the frequency of the clock signal, whereupon said phase frequency comparator delivers the timing signal corresponding to the phase difference and the frequency difference between the divided-frequency clock signal and the signal to be synchronized passed through said first ECL input buffer, while said phase comparator delivers the timing signal corresponding to the phase difference between the undivided frequency clock signal and the signal to be synchronized passed through said first ECL input buffer.

17. A phase-locked loop IC as defined in claim 1, further comprising at least one other first ECL input buffer, and a selector by which one of output signals from the plurality of first ECL input buffers is selected as the signal to be synchronized; wherein respective supply voltage systems of said plurality of first ECL input buffers are so disposed as to be isolated from each other, while respective ground systems of said plurality of first ECL input buffers are so disposed as to be isolated from each other.

18. A phase-locked loop IC as defined in claim 2, further comprising at least one other first ECL input buffer, and a selector by which one of output signals from the plurality of first ECL input buffers is selected as the signal to be synchronized; wherein respective supply voltage systems of said plurality of first ECL input buffers are so disposed as to be isolated from each other, while respective ground systems of said plurality of first ECL input buffers are so disposed as to be isolated from each other.

19. A phase-locked loop IC as defined in claim 1, wherein:
the signal to be synchronized is a data signal read out of a storage medium; and
a phase-lockable capture frequency range (capture range) of at least ±5%, and a phase-lockable follow-up frequency range (lock range) of at least ±5%, are secured for the data signal at a data transfer rate which lies within a range of, at least, 40 Mb.p.s. to 80 Mb.p.s.

20. A phase-locked loop IC as defined in claim 2, wherein:
the signal to be synchronized is a data signal read out of a storage medium; and
a phase-lockable capture frequency range (capture range) of at least ±5%, and a phase-lockable follow-up frequency range (lock range) of at least ±5%, are secured for the data signal at a data transfer rate which lies within a range of at least, 40 Mb.p.s. to 80 Mb.p.s.

21. A phase-locked loop IC as defined in claim 1, wherein:
the signal to be synchronized is a data signal read out of a storage medium which records data in conformity with the 1-7 RLL coding rule; and
a phase-lockable capture frequency range (capture range) of at least ±5%, and a phase-lockable follow-up frequency range (lock range) of at least ±5%, are secured for the data signal at a data transfer rate which lies within a range of 40 Mb.p.s. to 80 Mb.p.s.

22. A phase-locked loop IC as defined in claim 2, wherein:
the signal to be synchronized is a data signal read out of a storage medium which records data in conformity with the 1-7 RLL coding rule; and
a phase-lockable capture frequency range (capture range) of at least ±5%, and a phase-lockable follow-up frequency range (lock range) of at least ±5%, are secured for the data signal at a data transfer rate which lies within a range of 40 Mb.p.s. to 80 Mb.p.s.

23. A phase-locked loop IC as defined in claim 1, wherein:
the signal to be synchronized is a data signal read out of a storage medium which records data in conformity with the 2-7 RLL coding rule; and
a phase-lockable capture frequency range (capture range) of at least ±5%, and a phase-lockable follow-up frequency range (lock range) of at least ±5%, are secured for the data signal at a data transfer rate which lies within a range of 40 Mb.p.s. to 80 Mb.p.s.

24. A phase-locked loop IC as defined in claim 2, wherein:
the signal to be synchronized is a data signal read out of a storage medium which records data in conformity with the 2-7 RLL coding rule; and
a phase-lockable capture frequency range (capture range) of at least ±5%, and a phase-lockable follow-up frequency range (lock range) of at least ±5%, are secured for the data signal at a data transfer rate which lies within a range of 40 Mb.p.s. to 80 Mb.p.s.

25. A phase-locked loop IC as defined in claim 1, wherein the respective supply voltage systems are all fed with supply voltages of identical voltage value relative to the corresponding ground systems.

26. A phase-locked loop IC as defined in claim 2, wherein the respective supply voltage systems are all fed with supply voltages of identical voltage value relative to the corresponding ground systems.

27. A storage device comprising a storage medium, and a phase-locked loop IC as defined in claim 1, wherein the signal to be synchronized by said phase-locked loop IC is data signal read out of said storage medium.

28. A storage device comprising a storage medium, and a phase locked loop IC as defined in claim 2, wherein the signal to be synchronized by said phase-locked loop IC is data signal read out of said storage medium.

29. A storage device as defined in claim 28, wherein said storage medium is a magnetic disk.

30. An information processing system comprising a storage device as defined in claim 28, and an information processor which processes information by the use of said storage device.

31. An information processing system comprising a storage device as defined in claim 29, and an information processor which processes information by the use of said storage device.

* * * * *